US012727406B2

(12) United States Patent
Sung et al.

(10) Patent No.: US 12,727,406 B2

(45) Date of Patent: Sep. 1, 2026

(54) METHOD OF MANUFACTURING INTEGRATED CIRCUIT DEVICE

(71) Applicant: SAMSUNG ELECTRONICS CO., LTD., Suwon-si (KR)

(72) Inventors: Younghun Sung, Suwon-si (KR); Sunhye Hwang, Suwon-si (KR); Sangho Rha, Suwon-si (KR); Seungjae Sim, Suwon-si (KR); Younseok Choi, Suwon-si (KR); Byungkeun Hwang, Suwon-si (KR); Youn Joung Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 425 days.

(21) Appl. No.: 18/228,220

(22) Filed: Jul. 31, 2023

(65) Prior Publication Data

US 2024/0213017 A1 Jun. 27, 2024

(30) Foreign Application Priority Data

Dec. 19, 2022 (KR) ........................ 10-2022-0178689

(51) Int. Cl.

*H01L 21/02* (2006.01)
*C23C 16/34* (2006.01)
(Continued)

(52) U.S. Cl.

CPC ...... *H10P 14/69215* (2026.01); *C23C 16/345* (2013.01); *C23C 16/401* (2013.01); (Continued)

(58) Field of Classification Search

None
See application file for complete search history.

(56) References Cited

U.S. PATENT DOCUMENTS 5,976,626 A 11/1999 Matsubara et al.
8,637,411 B2 1/2014 Swaminathan et al.
(Continued)

FOREIGN PATENT DOCUMENTS

JP 04209533 A * 7/1992
JP 1996-236518 A 9/1996
JP 2003-059925 A 2/2003

OTHER PUBLICATIONS

H. Jung et al., J. Mater. Sci., 51, 5082-5091 (2016).
F. S. Becker et al., J, Electrochem. Soc., 134, 2923 (1987).
M. G. Hussein et al., J. Appl. Phys., 101, 023517 (2007).
M. Pauthe et al., J. Non-Cryst. Solids, 125, 195-201 (1990).

*Primary Examiner* — Asok K Sarkar

(74) *Attorney, Agent, or Firm* — Muir Patent Law, PLLC

(57) ABSTRACT

A method of manufacturing an integrated circuit device, the method including forming a doped silicon oxide film on a substrate by supplying, onto the substrate, a silicon precursor, an oxidant, and at least two dopant sources including dopant elements that are different from each other such that the doped silicon oxide film includes at least two dopant elements; forming a vertical hole in the doped silicon oxide film by dry-etching the doped silicon oxide film; and forming a vertical structure in the vertical hole, wherein the silicon precursor includes a monosilane compound, a disilane compound, a siloxane compound, or a combination thereof, and the silicon precursor includes a Si—H functional group, and a C1-C10 oxy group or a C1-C10 organoamino group.

20 Claims, 39 Drawing Sheets

(51) Int. Cl.

| | |
|---|---|
| ***C23C 16/40*** | (2006.01) |
| ***C23C 16/50*** | (2006.01) |
| ***C23C 16/56*** | (2006.01) |
| ***H10P 14/60*** | (2026.01) |
| ***H10P 14/692*** | (2026.01) |
| ***H10P 50/28*** | (2026.01) |
| *H10B 43/27* | (2023.01) |

(52) U.S. Cl.

CPC .............. *C23C 16/50* (2013.01); *C23C 16/56* (2013.01); *H10P 14/6336* (2026.01); *H10P 14/6682* (2026.01); *H10P 14/6686* (2026.01); *H10P 50/283* (2026.01); *H10B 43/27* (2023.02)

(56) References Cited

U.S. PATENT DOCUMENTS

| | | | |
|---|---|---|---|
| 9,200,167 B2 | 12/2015 | Spence et al. | |
| 9,502,234 B2 | 11/2016 | Xiao et al. | |
| 2004/0137758 A1* | 7/2004 | Li ..................... | H01L 21/76825 257/E21.576 |
| 2007/0147766 A1 | 6/2007 | Mattsson et al. | |
| 2011/0215445 A1* | 9/2011 | Yang .................... | C09D 183/04 524/588 |
| 2016/0181264 A1* | 6/2016 | Miyamoto ........ | H01L 21/28568 257/314 |
| 2022/0154337 A1* | 5/2022 | Zhang ..................... | C23C 16/36 |

* cited by examiner

METHOD OF MANUFACTURING INTEGRATED CIRCUIT DEVICE

CROSS-REFERENCE TO RELATED APPLICATION

This application is based on and claims priority under 35 U.S.C. § 119 to Korean Patent Application No. 10-2022-0178689, filed on Dec. 19, 2022, in the Korean Intellectual Property Office, the disclosure of which is incorporated by reference herein in its entirety.

BACKGROUND

1. Field

Embodiments relate to a method of manufacturing an integrated circuit device.

2. Description of the Related Art

Due to the advancement of electronics technology, integrated circuit devices have been rapidly down-scaled, and thus, patterns constituting electronic devices have been reduced to finer sizes. A method of manufacturing an integrated circuit device may facilitate the integrated circuit device to secure electrical characteristics and reliability even when unit devices required for an integrated circuit device have reduced pitches and increased aspect ratios.

SUMMARY

The embodiments may be realized by providing a method of manufacturing an integrated circuit device, the method including forming a doped silicon oxide film on a substrate by supplying, onto the substrate, a silicon precursor, an oxidant, and at least two dopant sources including dopant elements that are different from each other such that the doped silicon oxide film includes at least two dopant elements; forming a vertical hole in the doped silicon oxide film by dry-etching the doped silicon oxide film; and forming a vertical structure in the vertical hole, wherein the silicon precursor includes a monosilane compound, a disilane compound, a siloxane compound, or a combination thereof, and the silicon precursor includes a Si—H functional group, and a C1-C10 oxy group or a C1-C10 organoamino group.

The embodiments may be realized by providing a method of manufacturing an integrated circuit device, the method including forming a first structure on a substrate such that the first structure includes a nitride film; forming a doped silicon oxide film on the first structure by supplying, onto the first structure, a silicon precursor, an oxidant, and at least two dopant sources including dopant elements that are different from each other such that the doped silicon oxide film includes at least two dopant elements; forming a plurality of vertical holes through the doped silicon oxide film and the first structure by dry-etching the doped silicon oxide film and the first structure; and respectively forming a plurality of vertical structures in the plurality of vertical holes, wherein the silicon precursor includes a monosilane compound including C1-C10 oxy group and a Si—H functional group, a monosilane compound including a C1-C10 organoamino group and a Si—H functional group, a disilane compound including a C1-C10 oxy group and a Si—H functional group, a siloxane compound including a C1-C10 oxy group and a Si—H functional group, or a combination thereof.

The embodiments may be realized by providing a method of manufacturing an integrated circuit device, the method including forming a first structure, in which a plurality of silicon oxide films and a plurality of silicon nitride films are alternately stacked one by one in a vertical direction, on a substrate in a first area and a second area adjacent to each other in a horizontal direction; forming a doped silicon oxide film, which includes at least two dopant elements, in the second area to cover the first structure and the substrate by supplying, onto the substrate in the second area, a silicon precursor, an oxidant, and at least two dopant sources including dopant elements that are different from each other; forming a plurality of first vertical holes through the first structure in the first area and a plurality of second vertical holes through the doped silicon oxide film and the first structure in the second area, by simultaneously dry-etching the first structure and the doped silicon oxide film in the first area and the second area; and forming a plurality of vertical structures to respectively fill insides of the plurality of first vertical holes and the plurality of second vertical holes, wherein the silicon precursor includes a monosilane compound including C1-C10 oxy group and a Si—H functional group, a monosilane compound including a C1-C10 organoamino group and a Si—H functional group, a disilane compound including a C1-C10 oxy group and a Si—H functional group, a siloxane compound including a C1-C10 oxy group and a Si—H functional group, or a combination thereof.

BRIEF DESCRIPTION OF THE DRAWINGS

Features will be apparent to those of skill in the art by describing in detail exemplary embodiments with reference to the attached drawings in which:

FIGS. 7A to 13C are cross-sectional views of stages in a method of manufacturing an integrated circuit device, according to some embodiments, and in particular, FIGS. 7A, 8A, 9A, 10A, 11A, 12A, and 13A are cross-sectional views each illustrating some components in a region corresponding to the cross-section taken along the line X1-X1' of FIG. 2 according to a sequence of processes, FIGS. 7C, 10C, 11C, 12C, and 13C are cross-sectional views each illustrating some components in a region corresponding to the cross-section taken along the line Y1-Y1' of FIG. 2 according to the sequence of processes;

DETAILED DESCRIPTION

Figure 1:
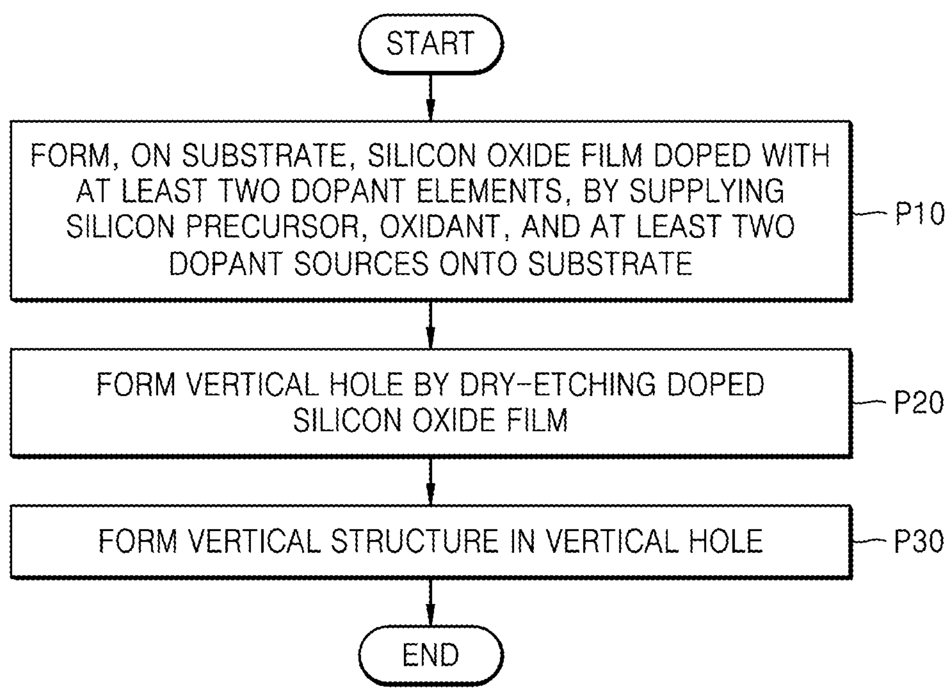
FIG. 1 is a flowchart illustrating a method of manufacturing an integrated circuit device, according to some embodiments.

Hereinafter, embodiments will be described in detail with reference to the accompanying drawings. Like components are denoted by like reference numerals throughout the specification, and repeated descriptions thereof may be omitted.

FIG. 1 is a flowchart illustrating a method of manufacturing an integrated circuit device, according to some embodiments.

Referring to FIG. 1, in process P10, a silicon oxide film doped with at least two dopant elements may be formed on a substrate by supplying, onto the substrate, a silicon precursor, an oxidant, and at least two dopant sources including different dopant elements from each other.

In process P10 of FIG. 1, a process of forming the doped silicon oxide film may be performed by a plasma-enhanced chemical vapor deposition (PECVD) process. As the PECVD process is performed to form the doped silicon oxide film, the silicon precursor, the oxidant, and the at least two dopant sources may be simultaneously supplied onto the substrate. In an implementation, in process P10 of FIG. 1, the process of forming the doped silicon oxide film may be performed by an atomic layer deposition (ALD) process.

As used herein, the term "substrate" may refer to a substrate itself, or a stack structure including a substrate and a certain layer or film or the like formed on a surface of the substrate. As used herein, the term "surface of a substrate" may refer to an exposed surface of the substrate itself, or an outer surface of a certain layer or film or the like formed on the substrate. The substrate may include a semiconductor substrate. In an implementation, the substrate may include a semiconductor, such as Si or Ge. In an implementation, the substrate may include a compound semiconductor, such as SiGe, SiC, GaAs, InAs, or InP. In an implementation, the substrate may have a silicon-on-insulator (SOI) structure. The substrate may include a conductive region, for example, a doped well or an impurity-doped structure. In an implementation, the substrate may include a transparent substrate. As used herein, the term "or" is not an exclusive term, e.g., "A or B" would include A, B, or A and B.

The silicon precursor may include a monosilane compound, a disilane compound, a siloxane compound, or a combination thereof. The silicon precursor may include a C1-C10 oxy group or a C1-C10 organoamino group, and may also include a Si—H functional group. In an implementation, the silicon precursor may include a monosilane compound including a C1-C10 oxy group and a Si—H functional group and may not include an organoamino group. As used herein, the term "C1-C10 oxy group" refers to a group having a structure of —O-alkane, —O-alkene, —O-alkyne, or —O-aryl (in which the organic groups have 1 to 10 carbon atoms). In an implementation, the silicon precursor may be represented by Formula 1.

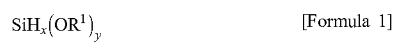

$$SiH_x(OR^1)_y \quad \text{[Formula 1]}$$

In Formula 1, $R^1$ may be or may include, e.g., a C1-C10 linear or branched alkyl group, a C2-C10 linear or branched alkenyl group, a C2-C10 linear or branched alkynyl group, a C3-C10 cycloalkyl group, or a C6-C10 aryl group.

x+y=4, x may be, e.g., an integer of 1 to 3, and y may be, e.g., an integer of 1 to 3.

In an implementation, the silicon precursor may include a monosilane compound including a C1-C10 organoamino group and a Si—H functional group and may not include an oxy group. In an implementation, the silicon precursor may be represented by Formula 2.

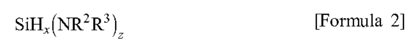

$$SiH_x(NR^2R^3)_z \quad \text{[Formula 2]}$$

In Formula 2, $R^2$ and $R^3$ may each independently be or include, e.g., a C1-C10 linear or branched alkyl group, a C2-C10 linear or branched alkenyl group, a C2-C10 linear or branched alkynyl group, a C3-C10 cycloalkyl group, or a C6-C10 aryl group.

x+y=4, x may be, e.g., an integer of 1 to 3, and y may be, e.g., an integer of 1 to 3.

In an implementation, the silicon precursor may include a disilane compound including a C1-C10 oxy group and a Si—H functional group and may not include an organoamino group. In an implementation, the silicon precursor may be represented by Formula 3.

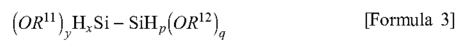

$$(OR^{11})_yH_xSi-SiH_p(OR^{12})_q \quad \text{[Formula 3]}$$

In Formula 3, $R^{11}$ and $R^{12}$ may each independently be or include, e.g., a C1-C10 linear or branched alkyl group, a C2-C10 linear or branched alkenyl group, a C2-C10 linear or branched alkynyl group, a C3-C10 cycloalkyl group, or a C6-C10 aryl group.

x+y=4, x may be, e.g., an integer of 1 to 3, y may be, e.g., an integer of 1 to 3.

p+q=4, p may be, e.g., an integer of 1 to 3, and p may be, e.g., an integer of 1 to 3.

In an implementation, the silicon precursor may include a siloxane compound including a C1-C10 oxy group and a Si—H functional group and may not include an organoamino group. In an implementation, the silicon precursor may be represented by Formula 4.

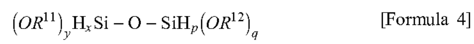

$$(OR^{11})_yH_xSi-O-SiH_p(OR^{12})_q \quad \text{[Formula 4]}$$

In Formula 4, $R^{11}$ and $R^{12}$ may each independently be or include, e.g., a C1-C10 linear or branched alkyl group, a C2-C10 linear or branched alkenyl group, a C2-C10 linear or branched alkynyl group, a C3-C10 cycloalkyl group, or a C6-C10 aryl group, x+y=4, x may be, e.g., an integer of 1 to 3, y may be, e.g., an integer of 1 to 3.

p+q=4, p may be, e.g., an integer of 1 to 3, and p may be, e.g., an integer of 1 to 3.

In an implementation, the silicon precursor may include a monosilane compound including a C1-C10 oxy group, a C1-C10 organoamino group, and a Si—H functional group. In an implementation, the silicon precursor may be represented by Formula 5.

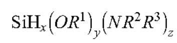

[Formula 5]

In Formula 5, $R^1$, $R^2$, and $R^3$ may each independently be or include, e.g., a C1-C10 linear or branched alkyl group, a C2-C10 linear or branched alkenyl group, a C2-C10 linear or branched alkynyl group, a C3-C10 cycloalkyl group, or a C6-C10 aryl group.

x+y+z=4, x may be, e.g., 1 or 2, y may be, e.g., 1 or 2, and z may be, e.g., 1 or 2.

In an implementation, the silicon precursor may include a disilane compound including a C1-C10 oxy group, a C1-C10 organoamino group, and a Si—H functional group. In this case, the silicon precursor may be represented by Formula 6.

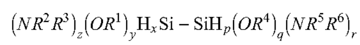

[Formula 6]

In Formula 6,

- $R^1$, $R^2$, $R^3$, $R^4$, $R^5$, and $R^6$ may each independently be or include, e.g., a C1-C10 linear or branched alkyl group, a C2-C10 linear or branched alkenyl group, a C2-C10 linear or branched alkynyl group, a C3-C10 cycloalkyl group, or a C6-C10 aryl group.

x+y+z=4, x may be, e.g., 1 or 2, y may be, e.g., 1 or 2, z may be, e.g., 1 or 2, p+q+r=4, p may be, e.g., 1 or 2, q may be, e.g., 1 or 2, and r may be, e.g., 1 or 2.

In Formulae 1 to 6, each of $R^1$, $R^2$, $R^3$, $R^{11}$, $R^{12}$, $R^4$, $R^5$, and $R^6$ may include, e.g., a methyl group, an ethyl group, an n-propyl group, an isopropyl group, an n-butyl group, an isobutyl group, a sec-butyl group, a tert-butyl group, an n-pentyl group, an isopentyl group, a neopentyl group, a hexyl group, a heptyl group, a 3-heptyl group, an isoheptyl group, a tert-heptyl group, an octyl group, an isooctyl group, a tert-octyl group, a 2-ethylhexyl group, a cyclopropyl group, a cyclobutyl group, a cyclopentyl group, a cyclohexyl group, a phenyl group, a benzyl group, a tolyl group, or an xylyl group.

In an implementation, the silicon precursor used in process P10 of FIG. 1 may include, e.g., a monosilane compound represented by one of Formulae 7A to 7F.

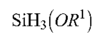

[Formula 7A]

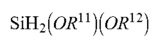

[Formula 7B]

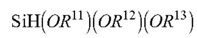

[Formula 7C]

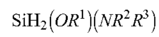

[Formula 7D]

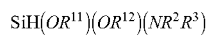

[Formula 7E]

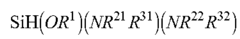

[Formula 7F]

In Formulae 7A to 7F, $R^{11}$, $R^{12}$, and $R^{13}$ may each be defined the same as $R^1$.

$R^{21}$ and $R^{22}$ may each be defined the same as $R^2$.

$R^{31}$ and $R^{32}$ may each be defined the same as $R^3$.

In an implementation, the monosilane compound, which may be used as the silicon precursor in process P10 of FIG. 1, may include one of the following compounds.

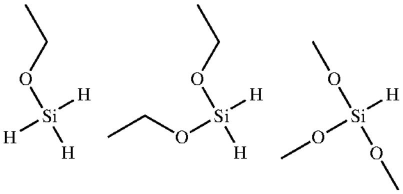

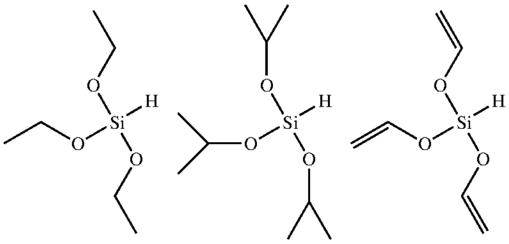

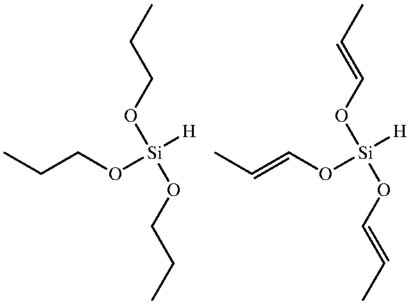

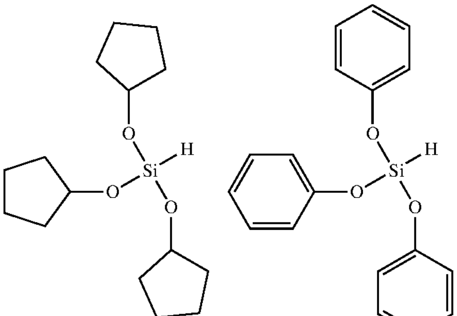

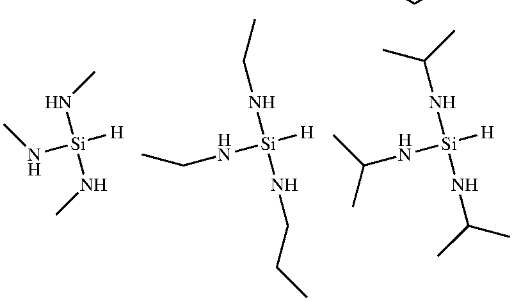

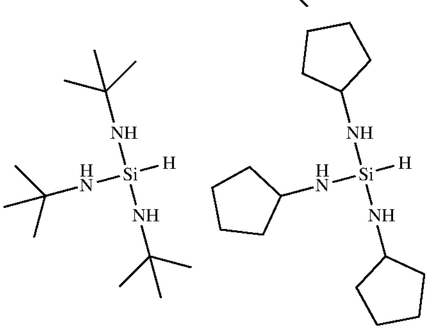

-continued

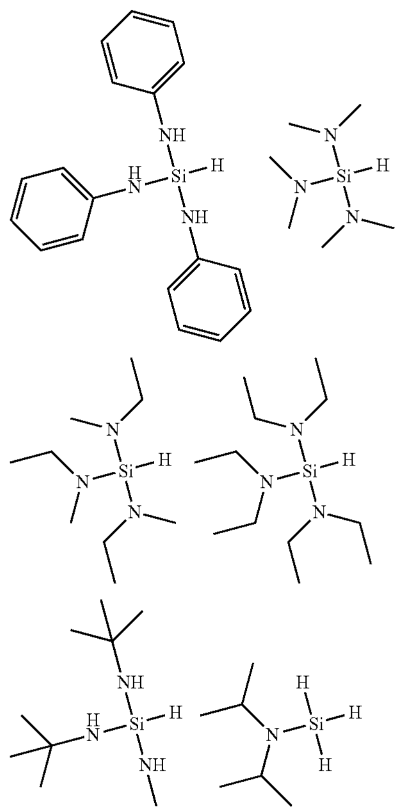

In an implementation, the disilane compound, which may be used as the silicon precursor in process P10 of FIG. 1, may include one of the following compounds.

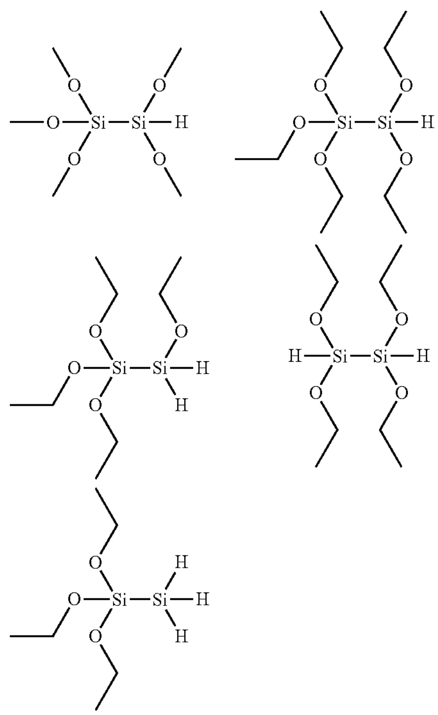

In an implementation, the siloxane compound, which may be used as the silicon precursor in process P10 of FIG. 1, may include one of the following compounds.

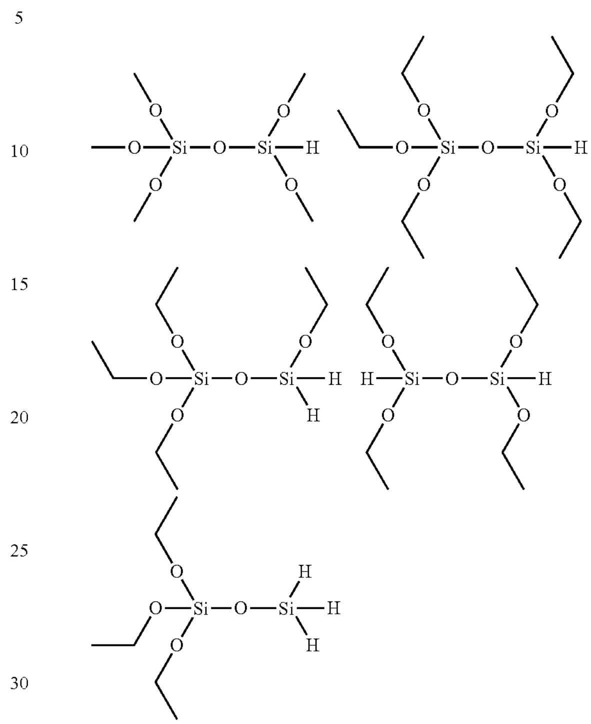

In process P10 of FIG. 1, the oxidant may include, e.g., $O_2$, $O_3$, $O_2$ plasma, $H_2O$, $NO_2$, NO, nitrous oxide ($N_2O$), CO, $CO_2$, $H_2O_2$, HCOOH, $CH_3COOH$, $(CH_3CO)_2O$, an alcohol, a peroxide, sulfur oxide, or a combination thereof.

In process P10 of FIG. 1, the at least two dopant elements may include, e.g., boron (B), phosphorus (P), nitrogen (N), fluorine (F), carbon (C), aluminum (Al), sulfur (S), arsenic (As), germanium (Ge), or antimony (Sb).

In an implementation, in the process of forming the doped silicon oxide film according to process P10 of FIG. 1, the silicon oxide film doped with phosphorus (P) and nitrogen (N) may be formed. In this case, the at least two dopant sources may include a phosphorus (P) source and a nitrogen (N) source.

In an implementation, in the process of forming the doped silicon oxide film according to process P10 of FIG. 1, the silicon oxide film doped with nitrogen (N) and fluorine (F) may be formed. In this case, the at least two dopant sources may include a nitrogen (N) source and a fluorine (F) source.

In the process of forming the doped silicon oxide film according to process P10 of FIG. 1, when the at least two dopant elements in the doped silicon oxide film include a nitrogen (N) atom, the monosilane compound of Formula 2, the monosilane compound of Formula 5, or the disilane compound of Formula 6 may be used as the silicon precursor. Each of the monosilane compound of Formula 2, the monosilane compound of Formula 5, and the disilane compound of Formula 6 may function as both a silicon precursor and a nitrogen (N) dopant source. Therefore, in the process of forming the doped silicon oxide film according to process P10 of FIG. 1, when the silicon precursor includes at least one compound selected from the monosilane compound of Formula 2, the monosilane compound of Formula 5, and the disilane compound of Formula 6, the dopant sources may not include an additional nitrogen (N) source as a dopant source.

In an implementation, in the process of forming the doped silicon oxide film according to process P10 of FIG. 1, as a boron (B) dopant source, trimethylboron ($B(CH_3)_3$) or triethylboron ($B(C_2H_5)_3$) may be used. As a phosphorus (P) dopant source, $PH_3$, trimethyl phosphate ($OP(OCH_3)_3$), triethyl phosphate ($OP(OC_2H_5)_3$), $P_4O_4$, $H_3PO_4$, $PF_3$, $PCl_3$, $PBr_3$, $PI_3$, $PF_5$, $PCl_5$, $PBr_5$, or $PI_5$ may be used. As a nitrogen (N) dopant source, a compound of Formulae 2, 5, or 6 described above may be used. In addition, as the nitrogen (N) dopant source, $N_2$, $NH_3$, $NF_3$, NCI, $NBr_3$, $NI_3$, $NHCl_2$, $NH_2Cl$, NFs, $N_2F_4$, or $N_2Cl_4$ may also be used. As a fluorine (F) dopant source, HF, $SiF_4$, $NH_4F$, LiF, NaF, KF, $TiF_4$, or $TaF_5$ may be used. As a carbon (C) dopant source, $CH_4$, $C_2H_4$, $C_2H_6$, $C_3H_7$, $C_3Hg$, i-$C_4H_{10}$, n-$C_4H_{10}$, $CBr_4$, $CCl_4$, trimethylaluminum, trimethylgallium, or trimethylindium may be used. As an aluminum (Al) dopant source, trimethylaluminum, triethylaluminum, or trichloroaluminum ($AlCl_3$) may be used. As a sulfur (S) dopant source, thiourea ($CH_4N_2S$) or ammonium thiosulfate ($(NH_4)_2S_2O_3$) may be used. As an arsenic (As) dopant source, $As(OCH_3)_3$, $As(OC_2H_5)_3$, $As(OC_3H_7)_3$, or $As(OC_4H_9)_3$ may be used. As a germanium (Ge) dopant source, $GeCl_4$, $GeH_4$, or digermane may be used. As an antimony (Sb) dopant source, $SbCl_3$, $SbBr_3$, $SbI_3$, $Sb(OC_2H_5)_3$, $Sb(OC_3H_7)_3$, or $Sb(OC_4H_9)_3$ may be used.

In process P20 of FIG. 1, a vertical hole may be formed in the doped silicon oxide film by dry-etching the doped silicon oxide film.

To form the vertical hole, the doped silicon oxide film may be anisotropically etched by using plasma generated from an etching gas mixture. For this purpose, the substrate including the doped silicon oxide film formed in process P10 may be loaded into a reaction chamber of a plasma etching apparatus.

In an implementation, the plasma etching apparatus may include a reactive ion etch (RIE) apparatus, a magnetically enhanced reactive ion etch (MERIE) apparatus, an inductively coupled plasma (ICP) apparatus, a capacitively coupled plasma (CCP) apparatus, a hollow anode type plasma apparatus, a helical resonator plasma apparatus, or an electron cyclotron resonance (ECR) apparatus.

The reaction chamber of the plasma etching apparatus may include a first electrode and a second electrode, which are arranged to face each other, and to which radio frequency (RF) power may be applied. The reaction chamber may provide a reaction space, in which a plasma etching process is performed, between the first electrode and the second electrode. The substrate including the doped silicon oxide film may be placed in the reaction space on the first electrode such that a main surface of the substrate faces the second electrode. While the substrate is placed on the first electrode, the etching process for forming the vertical hole in the doped silicon oxide film may be performed. In an implementation, the vertical hole may pass through the doped silicon oxide film.

To form the vertical hole in the doped silicon oxide film according to process P20 of FIG. 1, an etching gas mixture may be supplied into the reaction chamber in a plasma atmosphere. The etching gas mixture may include, e.g., a compound including $C_4F_8$, $C_4F_6$, $CF_4$, $CF_3H$, $CH_2F_2$, $CH_3F$, $CHF_3$, or a combination thereof and an inert gas. The etching gas mixture may further include at least one gas selected from a fluorine-containing gas and an oxygen-containing gas, as needed. The inert gas may include argon (Ar), helium (He), neon (Ne), nitrogen ($N_2$), krypton (Kr), xenon (Xe), or a mixture thereof. The fluorine-containing gas may include $NF_3$, $CF_4$, $F_2$, $SF_6$, or a combination thereof. The oxygen-containing gas may include $O_2$, $O_3$, CO, $CO_2$, NO, $N_2O$, $NO_2$, $CH_3OH$, $C_2H_5OH$, or a combination thereof.

In process P30 of FIG. 1, a vertical structure may be formed in the vertical hole.

In an implementation, the vertical structure may constitute a channel structure, a dummy channel structure, a word line cut structure, a through-electrode, a memory cell contact, or the like, which constitutes a memory cell array structure of VNAND flash memory. In an implementation, the vertical structure may include a lower electrode constituting a capacitor of DRAM.

In general, along with the higher integration of integrated circuit devices, the difficulty of a process of forming a silicon oxide film, which is widely used in integrated circuit devices, is gradually increased. To implement a silicon oxide film for a specific structure while maintaining insulating characteristics of the silicon oxide film, characteristics of the silicon oxide film may be controlled. For this purpose, according to an embodiment, to obtain characteristics of a silicon oxide film for specific circumstances while maintaining insulating characteristics of the silicon oxide film, a method of forming a doped silicon oxide film having characteristics suitable to apply to highly integrated circuit devices by changing the composition of a silicon oxide film through a doping technique, and a method of manufacturing an integrated circuit device by using the method set forth above are provided.

In general, insulating films of various compositions may have various etch rates depending on a specific etching method (e.g., dry etching, wet etching, plasma etching, or the like) and an etching atmosphere. In a manufacturing process of a VNAND device, to insulate a cell array area from a wiring area, a silicon oxide film may be formed by a PECVD method using tetraethyl orthosilicate (TEOS) gas and $O_2$ gas. To form a cell stack in a cell array area of a VNAND device, a mold structure, in which a silicon oxide film and a silicon nitride film are alternately stacked one by one, may be formed, and then, a silicon oxide film may be formed on the mold structure by using TEOS. Next, the silicon oxide film and the mold structure may be etched by an etching process, and wiring structures may be formed. However, along with the increasing number of stacks of cells, which are stacked in a vertical direction in the cell array area of the VNAND device, the height of the mold structure may be increased, and the thickness of a silicon oxide film formed in a wiring connection area may also be increased. Therefore, a process of forming a doped silicon oxide film may be used as one of the techniques of forming a silicon oxide film, which easily undergoes an etching process even when the silicon oxide film has a relatively high thickness while maintaining insulating characteristics thereof.

In forming a doped silicon oxide film, $SiH_4$ gas may be used as a silicon precursor, $SiH_4$ may be highly reactive due to relatively low Si—H binding energy and easily performs a binding reaction with other dopants, and the degree of freedom of doping of $SiH_4$ may be higher than the degree of freedom of doping of the silicon precursor including an oxy silane compound. Due to a relatively high sticking coefficient of an Si—H bond of $SiH_4$, when a silicon oxide film is formed by using $SiH_4$, the silicon oxide film may have deteriorated step coverage and thus have deteriorated surface roughness. In addition, due to the high reactivity of $SiH_4$, there could be an issue of the generation of a lot of particles during a process of forming a silicon oxide film, and thus, there may be restrictions on selecting reactants.

In forming a doped silicon oxide film, TEOS may be used as a silicon precursor, and there could be a drawback in that it may not be easy to perform doping of a specific element (e.g., nitrogen doping) in a structure with a step, e.g., a mold structure having a stepwise structure required to form a VNAND device.

According to an embodiment, when a doped silicon oxide film is formed by a codoping technique for performing doping with a plurality of dopant elements that are different from each other, a silicon precursor selected from the compounds of Formulae 1 to 6 may be used. Each of the compounds of Formulae 1 to 6 may include at least one Si—H functional group, and each of the compounds of Formulae 1 to 6 may provide relatively high reactivity due to relatively low binding energy of the Si—H functional group, thereby providing a relatively high degree of freedom of doping. In addition, the number of Si—H functional groups in each of the compounds of Formulae 1 to 6 may be relatively small, and issues, such as deterioration in step coverage and surface roughness of a silicon oxide film, particle generation, or the like, due to a relatively high sticking coefficient of an Si—H bond may be minimized.

In addition, according to an embodiment, in forming a doped silicon oxide film by a codoping technique for performing doping with a plurality of dopant elements that are different from each other, when the doped silicon oxide film is doped with a nitrogen (N) element, the monosilane compound of Formula 2, the monosilane compound of Formula 5, or the disilane compound of Formula 6 may be used as a silicon precursor. Each of the monosilane compound of Formula 2, the monosilane compound of Formula 5, and the disilane compound of Formula 6 may function as both a silicon precursor and a nitrogen (N) dopant source. Therefore, in the process of forming a doped silicon oxide film, when the silicon precursor includes the monosilane compound of Formula 2, the monosilane compound of Formula 5, or the disilane compound of Formula 6, the dopant sources may not separately include a nitrogen (N) source as a dopant source.

According to the method of manufacturing an integrated circuit device, which is described with reference to FIG. 1, a limit in doping in the case of using a general silicon precursor, which has been used so far to form a doped silicon oxide film, may be addressed. In an implementation, doping of at least one dopant element may be performed through a ligand decomposition of an oxy group or an amino group in a deposition process of a doped silicon oxide film by a PECVD process while insulating characteristics of the doped silicon oxide film are maintained, and doping of an additional element may be performed through reaction with an Si—H functional group, whereby different dopant elements from each other may be simultaneously doped.

In an implementation, in forming a silicon oxide film by a PECVD process, when a silicon precursor including a compound having an oxy group, such as the compounds of Formulae 1, 3, 4, 5, and 6, is used, an oxygen atom (O) and an organic group may be bonded to an Si central atom. O—C binding energy may be lower than Si—O binding energy in such a silicon precursor, and an O—C bond of an oxy ligand may be broken and an Si—O radical may be formed, in a high-temperature plasma atmosphere, thereby forming a silicon oxide film. In an implementation, when a silicon precursor including a compound having an organoamino group, such as the compounds of Formulae 2, 5, and 6, is used, an Si radical may be formed through ligand decomposition by plasma in a high-temperature plasma atmosphere due to relatively low Si—N binding energy, and the Si radical formed as such may be bonded with an oxidant, thereby forming a silicon oxide film.

In the method of manufacturing an integrated circuit device, according to an embodiment, a silicon oxide film doped with various combinations of various dopant elements may be efficiently formed, various effects, such as dielectric coefficient reduction and etch rate control through F or C doping, etch rate control through B or P doping, and improved mechanical properties of a doped silicon oxide film, may be obtained, and thus, there may be a contribution to improving operation characteristics of the integrated circuit device that is continuously advanced.

In addition, in the method of manufacturing an integrated circuit device, according to an embodiment, a doped silicon oxide film having excellent step coverage may be obtained. In an implementation, when a doped silicon oxide film is formed, a silicon precursor including an oxy ligand or an amino ligand may be used, thereby providing a silicon oxide film having excellent insulating characteristics. Furthermore, when a doped silicon oxide film is formed, an excellent degree of freedom of doping may be obtained by using a silicon precursor including an Si—H functional group, and in the process of forming a doped silicon oxide film by vapor deposition, a doping site due to decomposition of an oxy ligand and an additional doping site due to decomposition of an Si—H functional group are simultaneously provided, and doping of at least two elements different from each other may be performed by competing reactions between dopants and such doping sites. Therefore, a doped silicon oxide film having intended insulating characteristics may be formed by appropriately adjusting proportions of an oxy ligand and an Si—H functional group, and a doped silicon oxide film, which has characteristics controlled to be suitable for the performance of an integrated circuit device having a specific structure, may be formed through doping characteristics control.

Figure 2:
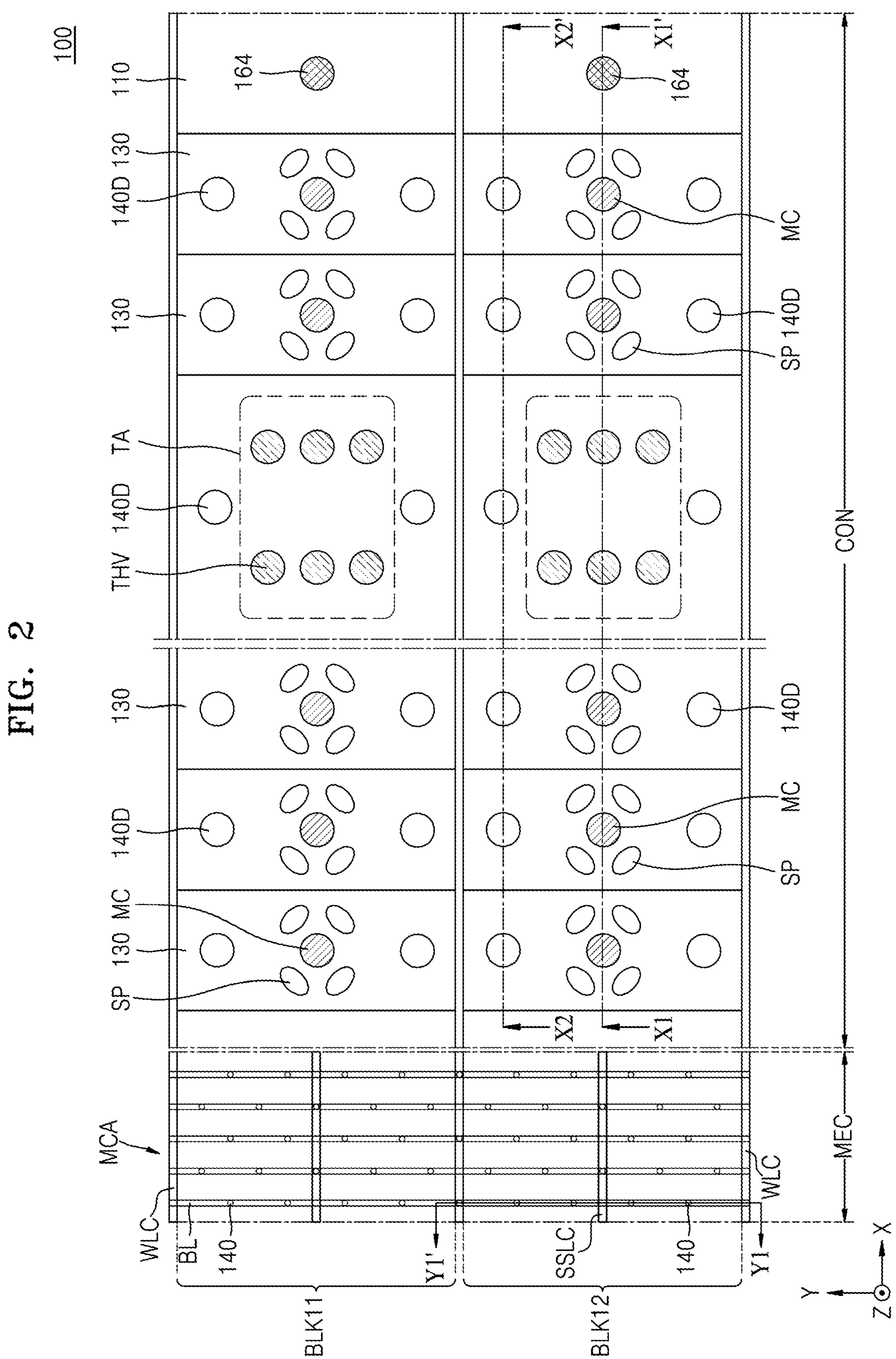
FIG. 2 is a plan view of an integrated circuit device according to some embodiments.
Figure 3A:
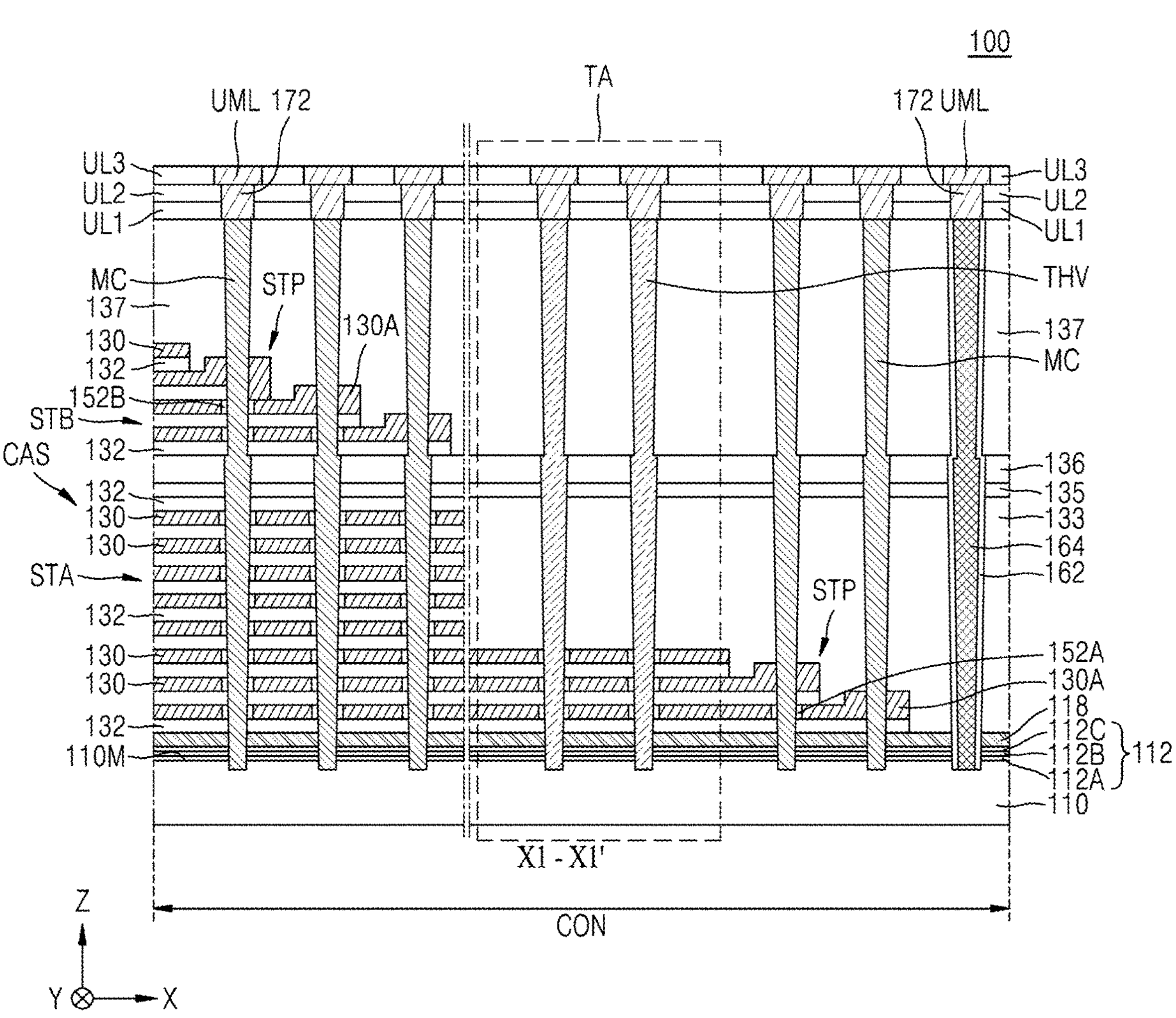
FIG. 3A is a cross-sectional view of the integrated circuit device, taken along a line X1-X1' of FIG. 2.
Figure 3B:
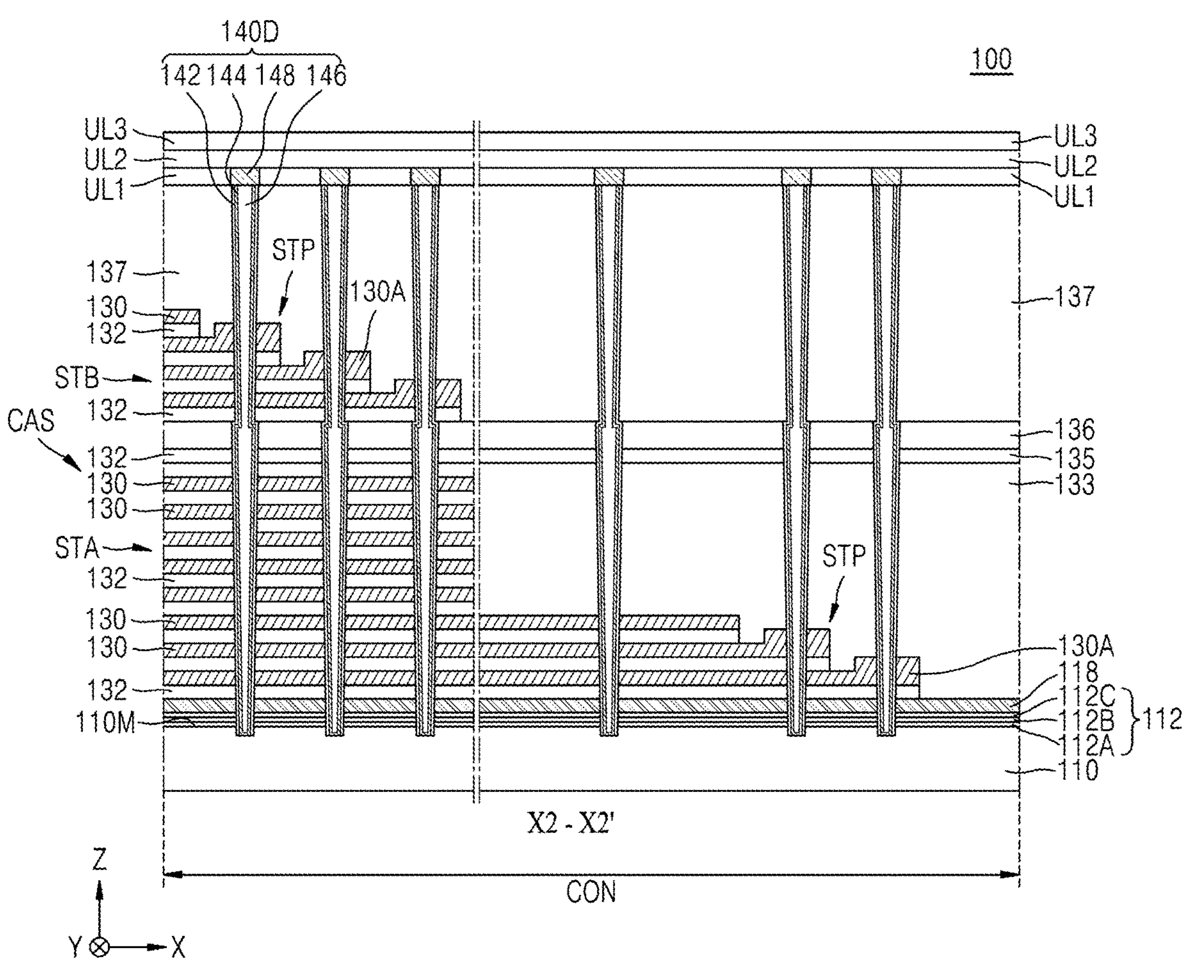
FIG. 3B is a cross-sectional view of the integrated circuit device, taken along a line X2-X2' of FIG. 2.
Figure 3C:
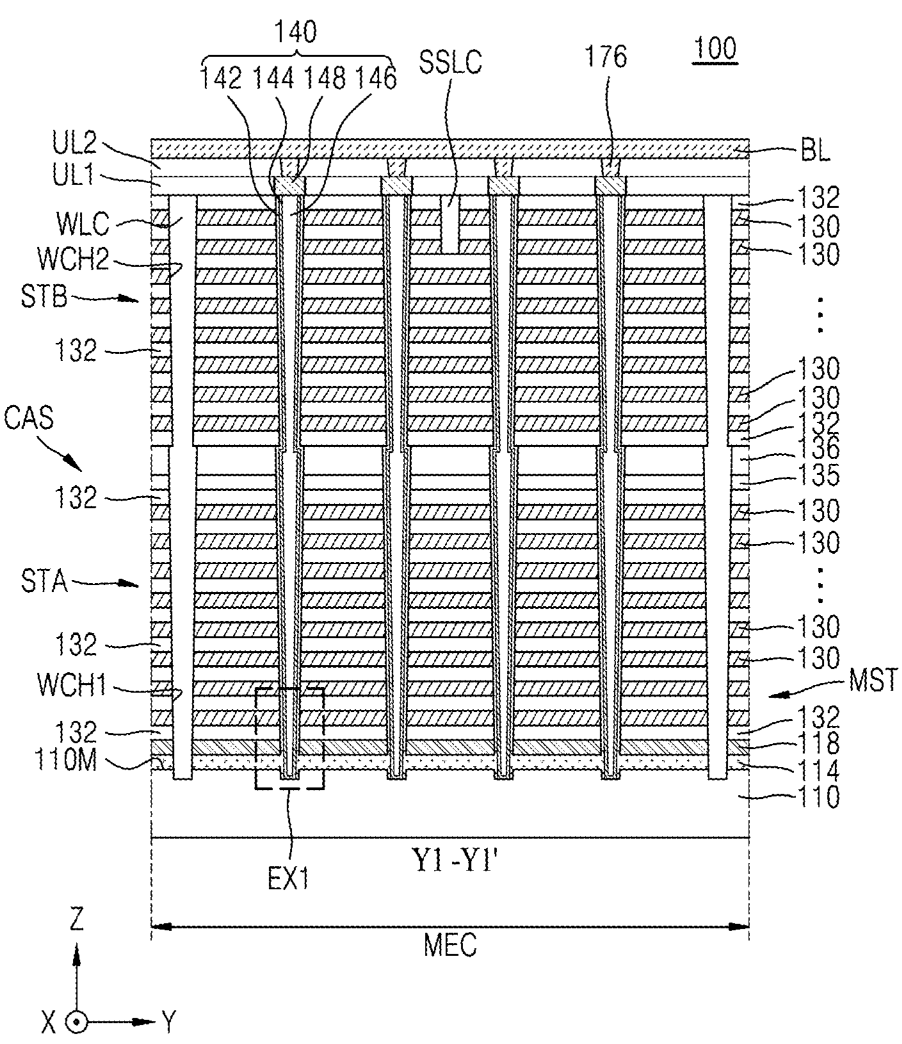
FIG. 3C is an enlarged cross-sectional view of the integrated circuit device, taken along a line Y1-Y1' of FIG. 2.
Figure 3D:
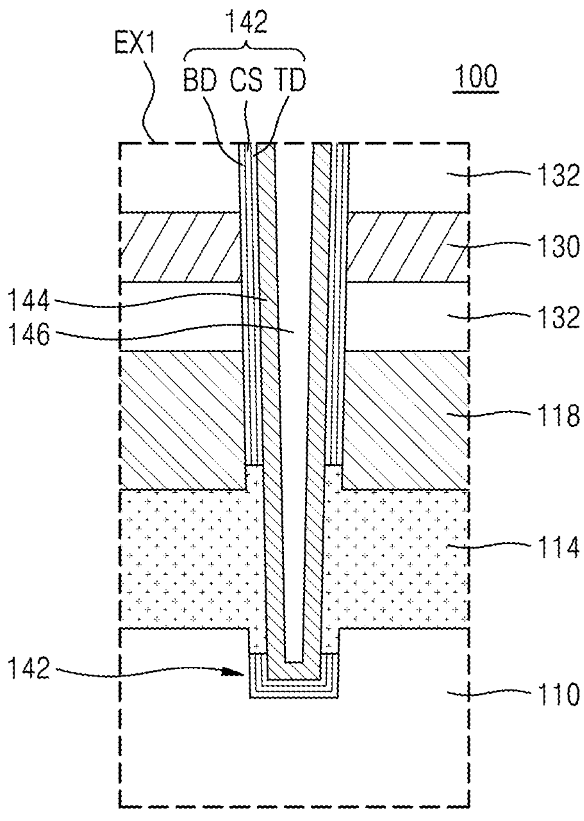
FIG. 3D is an enlarged cross-sectional view of some components in a region EX1 of FIG. 3C.

FIGS. 2 and 3A to 3D are diagrams illustrating an integrated circuit device 100 according to some embodiments in more detail. More specifically, FIG. 2 is a schematic plan view of some components of memory cell blocks BLK11 and BLK12. FIG. 3A is a cross-sectional view of the integrated circuit device 100, taken along a line X1-X1' of FIG. 2. FIG. 3B is a cross-sectional view of the integrated circuit device 100, taken along a line X2-X2' of FIG. 2. FIG. 3C is a cross-sectional view of the integrated circuit device 100, taken along a line Y1-Y1' of FIG. 2. FIG. 3D is an enlarged cross-sectional view of some components in a region EX1 of FIG. 3C.

Referring to FIGS. 2 and 3A to 3D, the integrated circuit device 100 may include a substrate 110 including a memory cell array MEC and a connection area CON, a first stack STA arranged at a first vertical level on the substrate 110, and a second stack STB arranged at a second vertical level, which is higher than the first vertical level, on the substrate 110. As used herein, the term "vertical level" refers to a distance from an upper surface of the substrate 110 in a vertical direction (Z direction or −Z direction).

Each of the first stack STA and the second stack STB may include a plurality of gate lines 130, which overlap each other in the vertical direction (Z direction) in the memory cell area MEC, and a stepwise connection portion STP having a plurality of conductive pad portions 130A, which are arranged in the connection area CON and respectively and integrally connected to the plurality of gate lines 130. The first stack STA and the second stack STB may constitute a cell array structure CAS. Herein, a gate line 130 in the first stack STA may be referred to as a "lower gate line", a conductive pad portion 130A in the first stack STA may be referred to as a "lower conductive pad portion", and a stepwise connection portion STP in the first stack STA may be referred to as a "lower stepwise connection portion". In addition, the gate line 130 in the second stack STB may be referred to as an "upper gate line", the conductive pad portion 130A in the second stack STB may be referred to as an "upper conductive pad portion", and the stepwise connection portion STP in the second stack STB may be referred to as an "upper stepwise connection portion".

As shown in FIGS. 3A and 3B, an insulating plate 112 and a second conductive plate 118 may be on the substrate 110 in the connection area CON, and as shown in FIG. 3C, a first conductive plate 114 and the second conductive plate 118 may be on the substrate 110 in the memory cell area MEC. In the memory cell area MEC and the connection area CON, a memory stack structure MST including the first stack STA and the second stack STB may be arranged on the second conductive plate 118.

In an implementation, in the memory cell area MEC, the first conductive plate 114 and the second conductive plate 118 may function as a common source line. The first conductive plate 114 and the second conductive plate 118 may function as a source region supplying currents to vertical memory cells of the cell array structure CAS.

In an implementation, the substrate 110 may include a semiconductor material, e.g., polysilicon. Each of the first conductive plate 114 and the second conductive plate 118 may include a doped polysilicon film, a metal film, or a combination thereof. The metal film may include, e.g., tungsten (W). Each of the plurality of gate lines 130 may include a metal, a metal silicide, an impurity-doped semiconductor, or a combination thereof. In an implementation, each of the plurality of gate lines 130 may include a metal, such as tungsten, nickel, cobalt, or tantalum, a metal silicide, such as tungsten silicide, nickel silicide, cobalt silicide, or tantalum silicide, doped polysilicon, or a combination thereof.

An insulating film 132 may be between the second conductive plate 118 and the plurality of gate lines 130 and between the plurality of gate lines 130. In each of the first stack STA and the second stack STB, an uppermost gate line 130 from among the plurality of gate lines 130 may be covered by the insulating film 132. The insulating film 132 may include silicon oxide.

As shown in FIGS. 3A and 3B, in the connection area CON, respective edge portions of the plurality of gate lines 130, the plurality of conductive pad portions 130A, and a plurality of insulating films 132, which are included in the first stack STA, may be covered by a lower insulating block 133. The lower insulating block 133 may be in contact with each of the plurality of gate lines 130, the plurality of conductive pad portions 130A, and the plurality of insulating films 132, which are included in the first stack STA. The lower insulating block 133 may have a surface facing the stepwise connection portion STP of the first stack STA, and an upper surface extending flat in a direction parallel to a main surface 110M of the substrate 110.

In the connection area CON, respective edge portions of the plurality of gate lines 130, the plurality of conductive pad portions 130A, and the plurality of insulating films 132, which are included in the second stack STB, may be covered by an upper insulating block 137. The upper insulating block 137 may be in contact with each of the plurality of gate lines 130, the plurality of conductive pad portions 130A, and the plurality of insulating films 132, which are included in the second stack STB. The upper insulating block 137 may have a surface facing the stepwise connection portion STP of the second stack STB, and an upper surface extending flat in a direction parallel to the main surface 110M of the substrate 110.

Each of the lower insulating block 133 and the upper insulating block 137 may include a doped silicon oxide film. In an implementation, each of the lower insulating block 133 and the upper insulating block 137 may include a doped silicon oxide film including at least two dopant elements of, e.g., phosphorus (P), nitrogen (N), boron (B), fluorine (F), or carbon (C). In an implementation, each of the lower insulating block 133 and the upper insulating block 137 may include a doped silicon oxide film including phosphorus (P) and nitrogen (N) as dopant elements. Each of the lower insulating block 133 and the upper insulating block 137 may include a doped silicon oxide film formed by the same method as described above regarding process P10 of FIG. 1.

An intermediate insulating film (e.g., 135 and 136) may be at a third vertical level between the first vertical level, at which the first stack STA is arranged, and the second vertical level, at which the second stack STB is arranged. The intermediate insulating film (e.g., 135 and 136) may include a first intermediate insulating film 135 and a second intermediate insulating film 136, which are stacked in the stated order on the first stack STA. Each of the first intermediate insulating film 135 and the second intermediate insulating film 136 may include a doped silicon oxide film. In an implementation, each of the first intermediate insulating film 135 and the second intermediate insulating film 136 may include a doped silicon oxide film. In an implementation, each of the first intermediate insulating film 135 and the second intermediate insulating film 136 may include a doped silicon oxide film including at least two dopant elements of, e.g., phosphorus (P), nitrogen (N), boron (B), fluorine (F), or carbon (C). In an implementation, each of the first intermediate insulating film 135 and the second intermediate insulating film 136 may include a doped silicon oxide film including phosphorus (P) and nitrogen (N) as dopant elements. Each of the first intermediate insulating film 135 and the second intermediate insulating film 136 may include a doped silicon oxide film formed by the same method as described above regarding process P10 of FIG. 1.

In each of the lower insulating block 133, the upper insulating block 137, the first intermediate insulating film 135, and the second intermediate insulating film 136, a doping concentration of a dopant element may be, e.g., about 0.1 at % to about 2 at %. In each of the lower insulating block 133, the upper insulating block 137, the first intermediate insulating film 135, and the second intermediate insulating film 136, the doping concentration of the dopant element may be constant along with positions or may vary with positions.

As shown in FIGS. 2 and 3C, in the memory cell area MEC and the connection area CON, a plurality of word line cut structures WLC may extend lengthwise in a first horizontal direction (X direction) on the substrate 110. The width of each of the plurality of gate lines 130 in a second horizontal direction (Y direction) may be defined by the plurality of word line cut structures WLC, the plurality of gate lines 130 being included in each of the memory cell blocks BLK11 and BLK12.

Each of the plurality of word line cut structures WLC may include an insulating structure. In an implementation, the insulating structure may include silicon oxide, silicon nitride, silicon oxynitride, or a low-K material. In an implementation, the insulating structure may include a silicon oxide film, a silicon nitride film, an SiON film, an SiOCN film, an SiCN film, or a combination thereof. In an implementation, at least a portion of the insulating structure may include an air gap. As used herein, the term "air" refers to the atmosphere, or other gases that may be present during a manufacturing process.

The plurality of gate lines 130 may be stacked on the second conductive plate 118 between two adjacent word line cut structures WLC to overlap each other in the vertical direction (Z direction).

Two upper gate lines 130 from among the plurality of gate lines 130 may each be divided in the second horizontal direction (Y direction) by a string select line cut structure SSLC. In an implementation, the string select line cut structure SSLC may include an insulating film including an oxide film, a nitride film, or a combination thereof. In an implementation, at least a portion of the string select line cut structure SSLC may include an air gap.

As shown in FIG. 3C, a plurality of channel structures 140 may pass through the plurality of gate lines 130, the plurality of insulating films 132, the first intermediate insulating film 135, the second intermediate insulating film 136, the second conductive plate 118, and the first conductive plate 114 to extend in the vertical direction (Z direction) on the substrate 110 in the memory cell area MEC. The plurality of channel structures 140 may be apart from each other by as much as a certain interval in the first horizontal direction (X direction) and the second horizontal direction (Y direction). Each of the plurality of channel structures 140 may include a gate dielectric film 142, a channel region 144, a buried insulating film 146, and a drain region 148.

As shown in FIG. 3D, the gate dielectric film 142 may include a tunneling dielectric film TD, a charge storage film CS, and a blocking dielectric film BD, which are in the stated order from the channel region 144 toward the gate line 130.

The tunneling dielectric film TD may include silicon oxide, hafnium oxide, aluminum oxide, zirconium oxide, tantalum oxide, or the like. The charge storage film CS is a region, in which electrons having passed from the channel region 144 through the tunneling dielectric film TD may be stored, and may include silicon nitride, boron nitride, silicon boron nitride, or impurity-doped polysilicon. The blocking dielectric film BD may include silicon oxide, silicon nitride, or a metal oxide having a dielectric constant that is greater than that of silicon oxide. The metal oxide may include hafnium oxide, aluminum oxide, zirconium oxide, tantalum oxide, or a combination thereof.

As shown in FIGS. 3C and 3D, the first conductive plate 114 may pass through a portion of the gate dielectric film 142 in a horizontal direction (X direction and/or Y direction) to be in contact with the channel region 144. The thickness (Z-direction size) of a portion of the first conductive plate 114, which vertically overlaps the gate dielectric film 142, may be greater than the thickness (Z-direction size) of a portion of the first conductive plate 114, which vertically overlaps the second conductive plate 118. The gate dielectric film 142 may include a portion covering a sidewall of the channel region 144 at a higher level than the first conductive plate 114, and a portion covering a lower surface of the channel region 144 at a lower level than the first conductive plate 114. The channel region 144 may be apart from the substrate 110 with a lowermost portion of the gate dielectric film 142 therebetween. The sidewall of the channel region 144 may be in contact with the first conductive plate 114 and configured to be electrically connectable to the first conductive plate 114.

As shown in FIGS. 3C and 3D, the channel region 144 may have a cylinder shape. The channel region 144 may include doped polysilicon or undoped polysilicon.

The buried insulating film 146 may fill an inner space of the channel region 144. The buried insulating film 146 may include an insulating material. In an implementation, the buried insulating film 146 may include silicon oxide, silicon nitride, silicon oxynitride, or a combination thereof. In an implementation, the buried insulating film 146 may be omitted. In an implementation, the channel region 144 may have a pillar structure without an inner space.

In the memory cell area MEC, respective uppermost surfaces of the string select line cut structure SSLC, the word line cut structure WLC, the gate dielectric film 142, the channel region 144, and the buried insulating film 146 may extend at an approximately equal vertical level. The drain region 148 may include a doped polysilicon film. A plurality of drain regions 148 may be insulated from each other by a first upper insulating film UL1 that covers the second stack STB.

In the memory cell area MEC and the connection area CON, a second upper insulating film UL2 and a third upper insulating film UL3 may be formed in the stated order on the plurality of channel structures 140 and the first upper insulating film UL1. Each of the first upper insulating film UL1, the second upper insulating film UL2, and the third upper insulating film UL3 may include an oxide film, a nitride film, or a combination thereof.

As shown in FIGS. 2 and 3C, a plurality of bit lines BL may be on the second upper insulating film UL2 in the memory cell area MEC of the memory cell structure MST. The plurality of bit lines BL may extend in the second horizontal direction (Y direction) to be parallel to each other. Each space between the plurality of bit lines BL may be filled with the third upper insulating film UL3. The drain region 148 of each of the plurality of channel structures 140 may be connected to a bit line BL via a contact plug 176, which passes through the second upper insulating film UL2.

As shown in FIGS. 3A and 3B, in the connection area CON, the insulating plate 112 and the second conductive plate 118 may be stacked in the stated order on the substrate 110. The insulating plate 112 may have a multilayer structure including a first insulating film 112A, a second insulating film 112B, and a third insulating film 112C, which are stacked in the stated order on the substrate 110. In an implementation, the first insulating film 112A and the third insulating film 112C may each include a silicon oxide film, and the second insulating film 112B may include a silicon nitride film.

In the connection area CON, a conductive pad portion 130A may be at one end of each of the plurality of gate lines 130 in each of the first stack STA and the second stack STB, the conductive pad portion 130A having a thickness greater in the vertical direction (Z direction) than those of other portions of the gate line 130. The conductive pad portion 130A may be integrally connected with an edge portion of the gate line 130, which is farthest from the memory cell area MEC. FIGS. 3A and 3B illustrate only the conductive pad portions 130A respectively connected to ends of some gate lines 130 from among the plurality of gate lines 130, and the other gate lines 130 may also be respectively and integrally connected with the conductive pad portions 130A, in other areas not shown in FIGS. 3A and 3B.

As shown in FIG. 2, a plurality of memory cell contacts MC and a plurality of insulating support structures SP may be in the connection area CON. Each of the plurality of memory cell contacts MC may be electrically connectable to one conductive pad portion 130A selected from the plurality of conductive pad portions 130A, which are included in the first stack STA and the second stack STB. The plurality of insulating support structures SP may pass through the first stack STA and the second stack STB in the vertical direction to support each of the first stack STA and the second stack STB in the connection area CON. Herein, each of the plurality of memory cell contacts MC and the plurality of insulating support structures SP may be referred to as a plug structure.

Some memory cell contacts MC selected from the plurality of memory cell contacts MC may be apart from the stepwise connection portion STP of the second stack STB in a horizontal direction (X direction in FIG. 3A). The memory cell contacts MC selected from the plurality of memory cell contacts MC may pass through the stepwise connection portion STP of the first stack STA, the lower insulating block 133, the first intermediate insulating film 135, the second intermediate insulating film 136, and the upper insulating block 137 in the vertical direction (Z direction) and may each be configured to be electrically connectable to one conductive pad portion 130A selected from the plurality of conductive pad portions 130A of the first stack STA.

Some other memory cell contacts MC selected from the plurality of memory cell contacts MC may pass through the stepwise connection portion STP of the second stack STB in the vertical direction (Z direction) and may each be electrically connectable to one conductive pad portion 130A selected from the plurality of conductive pad portions 130A of the second stack STB.

Some memory cell contacts MC selected from the plurality of memory cell contacts MC may each include a portion surrounded by the lower insulating block 133, a portion surrounded by the intermediate insulating film (that is, 135 and 136), and a portion surrounded by the upper insulating block 137. Some other memory cell contacts MC selected from the plurality of memory cell contacts MC may each include a portion, which is apart from the lower insulating block 133 in a horizontal direction and surrounded by the intermediate insulating film (e.g., 135 and 136), and a portion surrounded by the upper insulating block 137.

As shown in FIG. 3A, each of the plurality of memory cell contacts MC may pass through at least some of the plurality of gate lines 130 and the plurality of insulating films 132. Each of the plurality of memory cell contacts MC may be arranged in a hole passing through at least one of the plurality of gate lines 130.

Similar to the plurality of memory cell contacts MC, each of the plurality of insulating support structures SP (see FIG. 2) may pass through at least some of the plurality of gate lines 130 and the plurality of insulating films 132. Each of the plurality of insulating support structures SP may be arranged in a hole passing through at least one of the plurality of gate lines 130.

Each of the plurality of memory cell contacts MC may be connected to one gate line 130 selected from the plurality of gate lines 130 and may not be connected to the other gate lines 130 except for the selected one gate line 130. Each of the plurality of memory cell contacts MC may be in contact with the conductive pad portion 130A of one gate line 130 selected from the plurality of gate lines 130 and may be connected to the selected one gate line 130 via the conductive pad portion 130A.

In an implementation, each of the plurality of memory cell contacts MC may include, e.g., tungsten, titanium, tantalum, copper, aluminum, titanium nitride, tantalum nitride, tungsten nitride, or a combination thereof. Each of the plurality of insulating support structures SP may include, e.g., silicon oxide.

Each of the plurality of memory cell contacts MC may be apart from the other gate lines 130, except for the selected one gate line 130, in a horizontal direction. In the first stack STA, a first insulating ring 152A may be arranged between each of the plurality of memory cell contacts MC and another gate line 130 not connected thereto. In the second stack STB, a second insulating ring 152B may be arranged between each of the plurality of memory cell contacts MC and another gate line 130 not connected thereto. In some embodiments, each of the first insulating ring 152A and the second insulating ring 152B may include, e.g., a silicon oxide film.

As shown in FIGS. 2 and 3B, a plurality of dummy channel structures 140D may be arranged in the connection area CON. The plurality of dummy channel structures 140D may include a plurality of dummy channel structures 140D passing through the stepwise connection portion STP of the first stack STA in the vertical direction (Z direction), and a plurality of dummy channel structures 140D passing through the stepwise connection portion STP of each of the first stack STA and the second stack STB and the intermediate insulating film (that is, 135 and 136) in the vertical direction (Z direction). In an implementation, as illustrated in FIG. 3B each of the plurality of dummy channel structures 140D may pass through the conductive pad portion 130A of the stepwise connection portion STP in the vertical direction (Z direction). In an implementation, at least some of the plurality of dummy channel structures 140D may each pass through a portion of the gate line 130, which is apart from the conductive pad portion 130A in a horizontal direction, in the vertical direction (Z direction) in the connection area CON. Herein, each of the plurality of dummy channel structures 140D may be referred to as a plug structure.

Some dummy channel structures 140D selected from the plurality of dummy channel structures 140D may pass through the stepwise connection portion STP of the first stack STA, the lower insulating block 133, the first intermediate insulating film 135, the second intermediate insulating film 136, and the upper insulating block 137 in the vertical direction (Z direction). Some other dummy channel structures 140D selected from the plurality of dummy channel structures 140D may pass through the stepwise connection portion STP of the first stack STA, the first intermediate insulating film 135, the second intermediate insulating film 136, the stepwise connection portion STP of the second stack STB, and the upper insulating block 137 in the vertical direction (Z direction).

In the connection area CON, the plurality of dummy channel structures 140D may be apart from each other by as much as a certain interval in the first horizontal direction (X direction) and the second horizontal direction (Y direction). Similar to the channel structure 140 in the memory cell array MEC, each of the plurality of dummy channel structures 140D may include the gate dielectric film 142, the channel region 144, the buried insulating film 146, and the drain region 148. In an implementation, a planar size of each of the plurality of dummy channel structures 140D may be greater than a planar size of the channel structure 140. The number and arrangement shape of the plurality of dummy channel structures 140D shown in FIG. 2 are only examples. In the connection area CON, the plurality of dummy channel structures 140D may be in various forms at various positions selected in the memory stack structure MST.

As shown in FIGS. 3A and 3B, in the connection area CON, the upper insulating block 137 may be covered by the first upper insulating film UL1. In the connection area CON, the plurality of dummy channel structures 140D may be covered by the second upper insulating film UL2.

As shown in FIGS. 2 and 3A, a conductive plate contact 164 may be in the connection area CON. The conductive plate contact 164 may pass through the upper insulating block 137, the intermediate insulating film (that is, 135 and 136), the lower insulating block 133, the second conductive plate 118, and the insulating plate 112 to extend to the substrate 110 in the vertical direction (Z direction). A sidewall of the conductive plate contact 164 may be covered by an insulating spacer 162. The insulating spacer 162 may include a silicon oxide film.

The plurality of memory cell contacts MC and the conductive plate contact 164 may each be connected to one upper wiring layer UML from among a plurality of upper wiring layers UML via a contact plug 172, which passes through the first upper insulating film UL1 and the second upper insulating film UL2. The plurality of upper wiring layers UML may be at the same vertical level as the plurality of bit lines BL in the memory cell area MEC. Each space between the plurality of upper wiring layers UML may be filled with the third upper insulating film UL3.

Respective uppermost surfaces of the plurality of memory cell contacts MC, the plurality of insulating support structures SP, and the conductive plate contact 164 may extend at an approximately equal vertical level. In an implementation, the conductive plate contact 164, a plurality of contact plugs 172, a plurality of contact plugs 176, the plurality of upper wiring layers UML, and the plurality of bit lines BL may each include, e.g., tungsten, titanium, tantalum, copper, titanium nitride, tantalum nitride, tungsten nitride, or a combination thereof.

As shown in FIG. 3A, each of the memory cell blocks BLK11 and BLK12 of the integrated circuit device 100 may include a through-electrode area TA, which includes a plurality of through-electrodes THV arranged in the connection area CON. Herein, each of the plurality of through-electrodes THV may be referred to as a plug structure.

Each of the plurality of through-electrodes THV may pass through at least one of the stepwise connection portion STP of the first stack STA and the stepwise connection portion STP of the second stack STB in the vertical direction (Z direction). Each of the plurality of through-electrodes THV may not to be electrically connected to the gate line 130 and the conductive pad portion 130A, which are included in the first stack STA and the second stack STB.

As shown in FIG. 3A, some through-electrodes THV selected from the plurality of through-electrodes THV may each include a portion surrounded by the lower insulating block 133, a portion surrounded by the intermediate insulating film (that is, 135 and 136), and a portion surrounded by the upper insulating block 137. In the connection area CON, respective uppermost surfaces of the plurality of memory cell contacts MC, the plurality of through-electrodes THV, and the conductive plate contact 164 may extend at an approximately equal vertical level.

Each of the plurality of through-electrodes THV may pass through at least some of the plurality of gate lines 130 and the plurality of insulating films 132. Each of the plurality of through-electrodes THV may be in a hole that passes through at least one of the plurality of gate lines 130. Each of the plurality of through-electrodes THV may not be connected to the gate line 130. Each of the plurality of through-electrodes THV may be apart from the gate line 130 in a horizontal direction. Each of the plurality of through-electrodes THV may include, e.g., tungsten, titanium, tantalum, copper, aluminum, titanium nitride, tantalum nitride, tungsten nitride, or a combination thereof.

In the first stack STA, the first insulating ring 152A may be between the plurality of through-electrodes THV and the gate line 130 adjacent thereto. When the plurality of through-electrodes THV pass through the second stack STB, the second insulating ring 152B may also be between the plurality of through-electrodes THV and the gate line 130 adjacent thereto, in the second stack STB.

According to the integrated circuit device 100 described with reference to FIGS. 2 to 3D, in the connection area CON of the cell array structure CAS, insulating structures occupying relatively high volumes, e.g., the lower insulating block 133 and the upper insulating block 137 may each include a silicon oxide film doped with at least two dopant elements. When the number of stacks of the gate line 130, which constitute the memory stack structure MST, in the vertical direction (Z direction) is increased to improve the degree of integration of the integrated circuit device 100, and thus, the cell array structure CAS includes a plurality of stacks including the first stack STA and the second stack STB, there may be a need to form a plurality of vertical holes with high aspect ratios by dry-etching a structure including at least one of the lower insulating block 133 and the upper insulating block 137. Even in such a case, ion scattering generated in a hole portion, which passes through the lower insulating block 133 or the upper insulating block 137, during the dry-etching process may be prevented, and thus, the vertical holes may be effectively prevented from suffering from bowing.

In addition, in the integrated circuit device 100 according to an embodiment, in a deposition process for forming a silicon oxide film, which constitutes each of the lower insulating block 133, the upper insulating block 137, the first intermediate insulating film 135, and the second intermediate insulating film 136, a silicon precursor including a C1-C10 oxy group or a C1-C10 organoamino group and a Si—H functional group may be used, as described with reference to process P10 of FIG. 1. Each of the lower insulating block 133, the upper insulating block 137, the first intermediate insulating film 135, and the second intermediate insulating film 136, which are obtained by such a method, may help improve the productivity of a manufacturing process of the integrated circuit device 100 due to a relatively high dry-etch rate when a plurality of vertical holes are formed by etching the lower insulating block 133, the upper insulating block 137, the first intermediate insulating film 135, the second intermediate insulating film 136 at a relatively low process temperature of room temperature (e.g., about 20° C. to about 28° C.) to about 100° C.

Therefore, in manufacturing the integrated circuit device 100 according to some embodiments, in the case of forming vertical holes with relatively high aspect ratios to form plug structures that pass through at least one of the first stack STA, the second stack STB, the lower insulating block 133, and the upper insulating block 137, even when various films having different etching characteristics from each other may be etched under given etching conditions, the vertical holes may be suppressed from suffering from bowing due to ion scattering therein, and thus, a separation distance between plug structures respectively filling the vertical holes may be stably maintained. Therefore, the manufacturing process of the integrated circuit device 100 may be facilitated and have improved productivity, and the electrical characteristics and reliability of the integrated circuit device 100 may be maintained.

Figure 4:
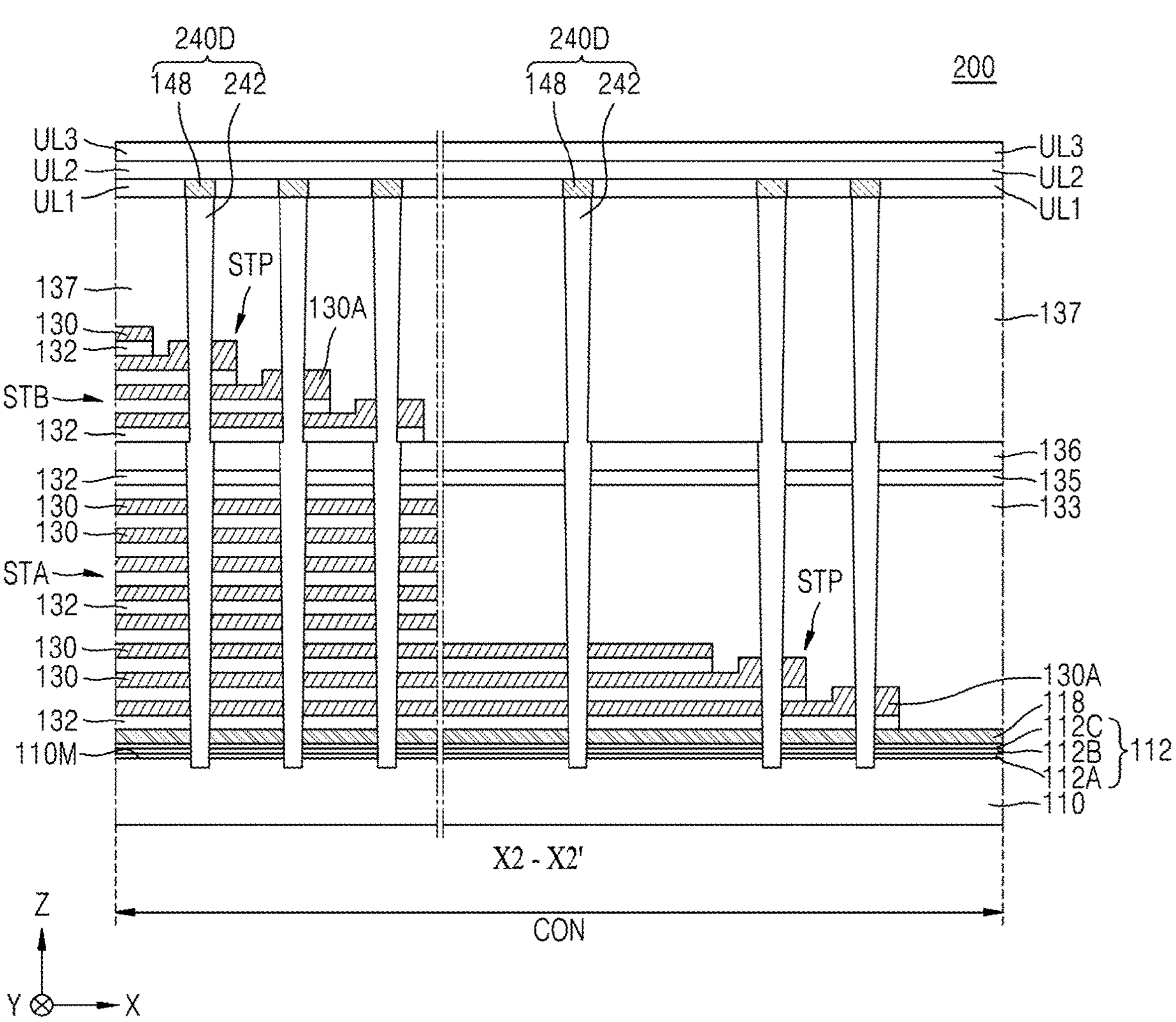
FIG. 4 is a cross-sectional view illustrating an integrated circuit device according to some embodiments.

FIG. 4 is a cross-sectional view illustrating an integrated circuit device 200 according to some embodiments. FIG. 4 illustrates some components of a region corresponding to a cross-section taken along the line X2-X2' of FIG. 2.

Referring to FIG. 4, the integrated circuit device 200 may have substantially the same configuration as the integrated circuit device 100 described with reference to FIGS. 2 to 3D. However, the integrated circuit device 200 includes a plurality of dummy channel structures 240D instead of the plurality of dummy channel structures 140D.

The plurality of dummy channel structures 240D may have substantially the same configuration as the plurality of dummy channel structures 140D. In an implementation, each of the plurality of dummy channel structures 240D may include a dummy insulating structure 242 instead of the gate dielectric film 142, the channel region 144, and the buried insulating film 146, which are shown in FIG. 3B. In an implementation, the drain region 148 may be omitted from each of the plurality of dummy channel structures 240D. In an implementation, the dummy insulating structure 242 may include, e.g., silicon oxide.

Figure 5:
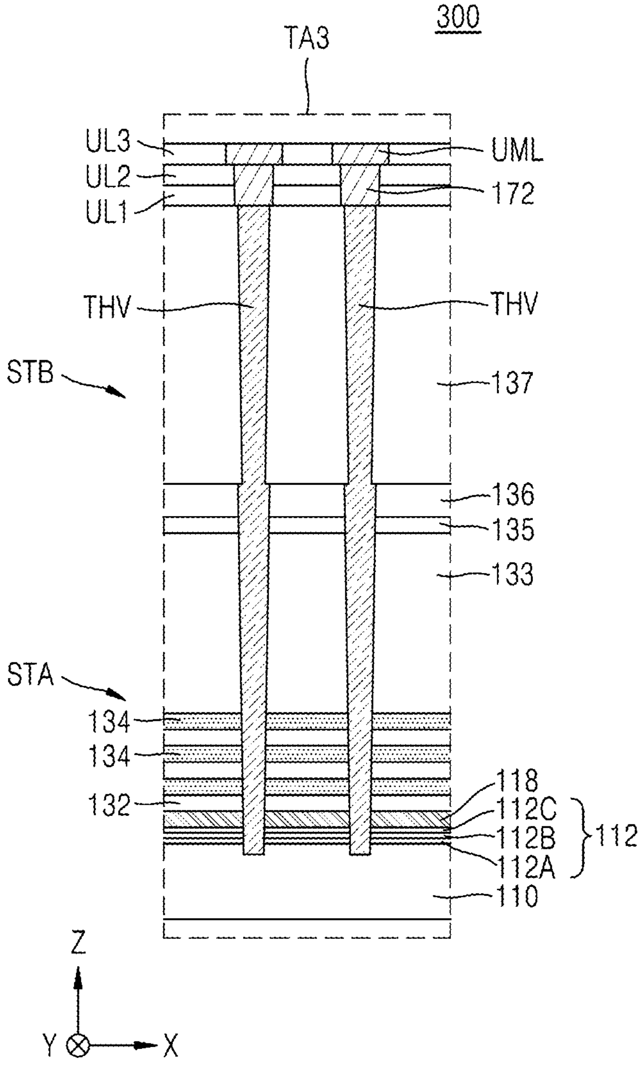
FIG. 5 is a cross-sectional view illustrating an integrated circuit device according to some embodiments.

FIG. 5 is a cross-sectional view illustrating an integrated circuit device 300 according to some embodiments. FIG. 5 illustrates a cross-sectional configuration of a region corresponding to the through-electrode area TA of FIGS. 2 and 3A.

Referring to FIG. 5, the integrated circuit device 300 may have substantially the same configuration as the integrated circuit device 100 described with reference to FIGS. 2 to 3D. In an implementation, the integrated circuit device 300 may include a through-electrode area TA3 instead of the through-electrode area TA.

In the integrated circuit device 300, some of the plurality of gate lines 130 (see FIG. 3A) may be substituted with a sacrificial insulating film 134, in a region of the stepwise connection portion STP of the first stack STA shown in FIGS. 2 and 3A, which corresponds to the through-electrode area TA. In the through-electrode area TA3, a sidewall of each of the plurality of through-electrodes THV may be surrounded by the plurality of insulating films 132 and a plurality of sacrificial insulating films 134. In an implementation, each of the plurality of sacrificial insulating films 134 may include a silicon nitride film.

In an implementation, a dam structure may be between an insulating structure and the plurality of gate lines 130 (see FIGS. 3A to 3C), the insulating structure including the plurality of insulating films 132 and the plurality of sacrificial insulating films 134, which constitute the through-electrode area TA3.

Figure 6A:
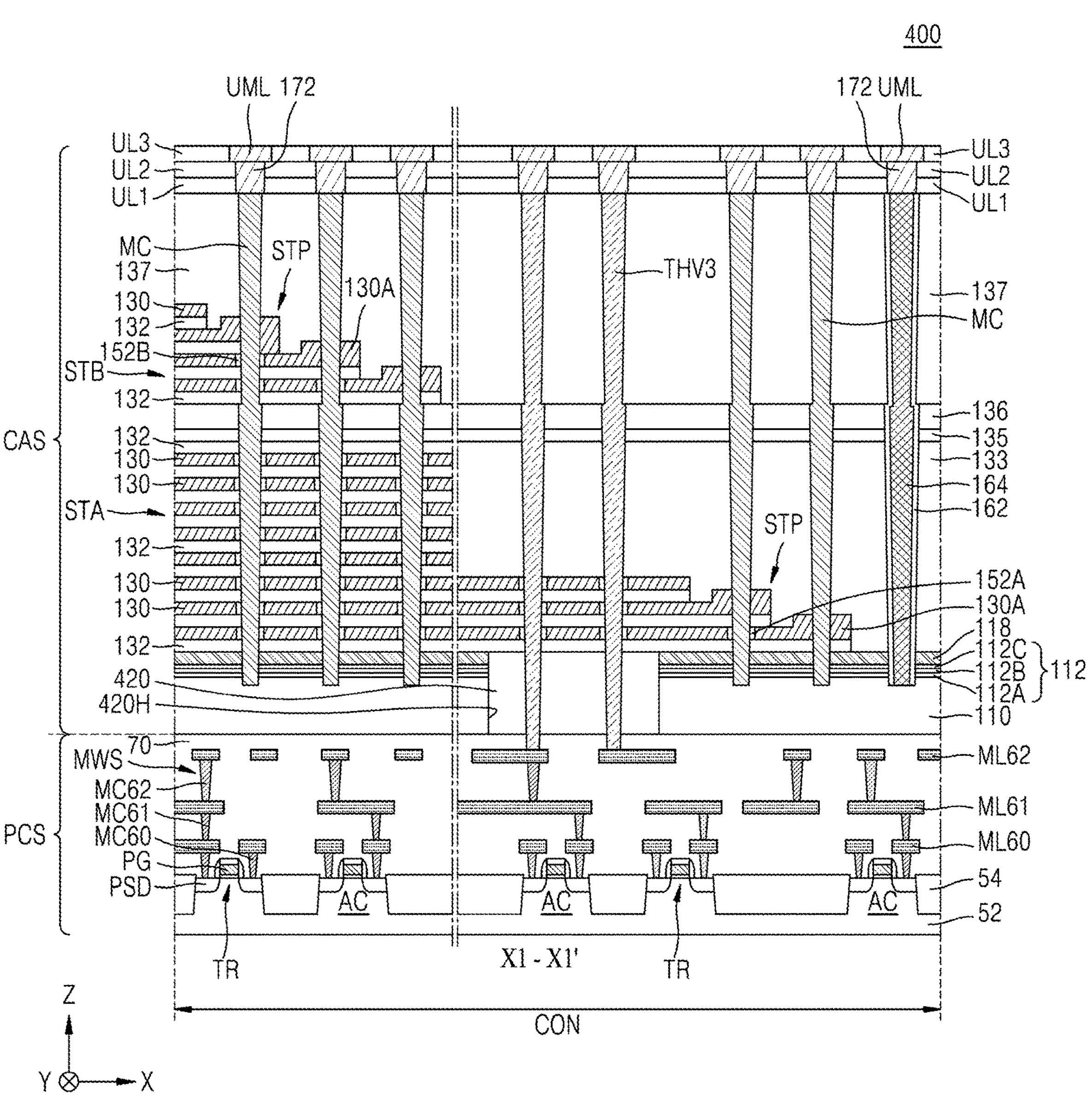
FIGS. 6A, 6B, and 6C are cross-sectional views illustrating an integrated circuit device according to some embodiments.
Figure 6B:
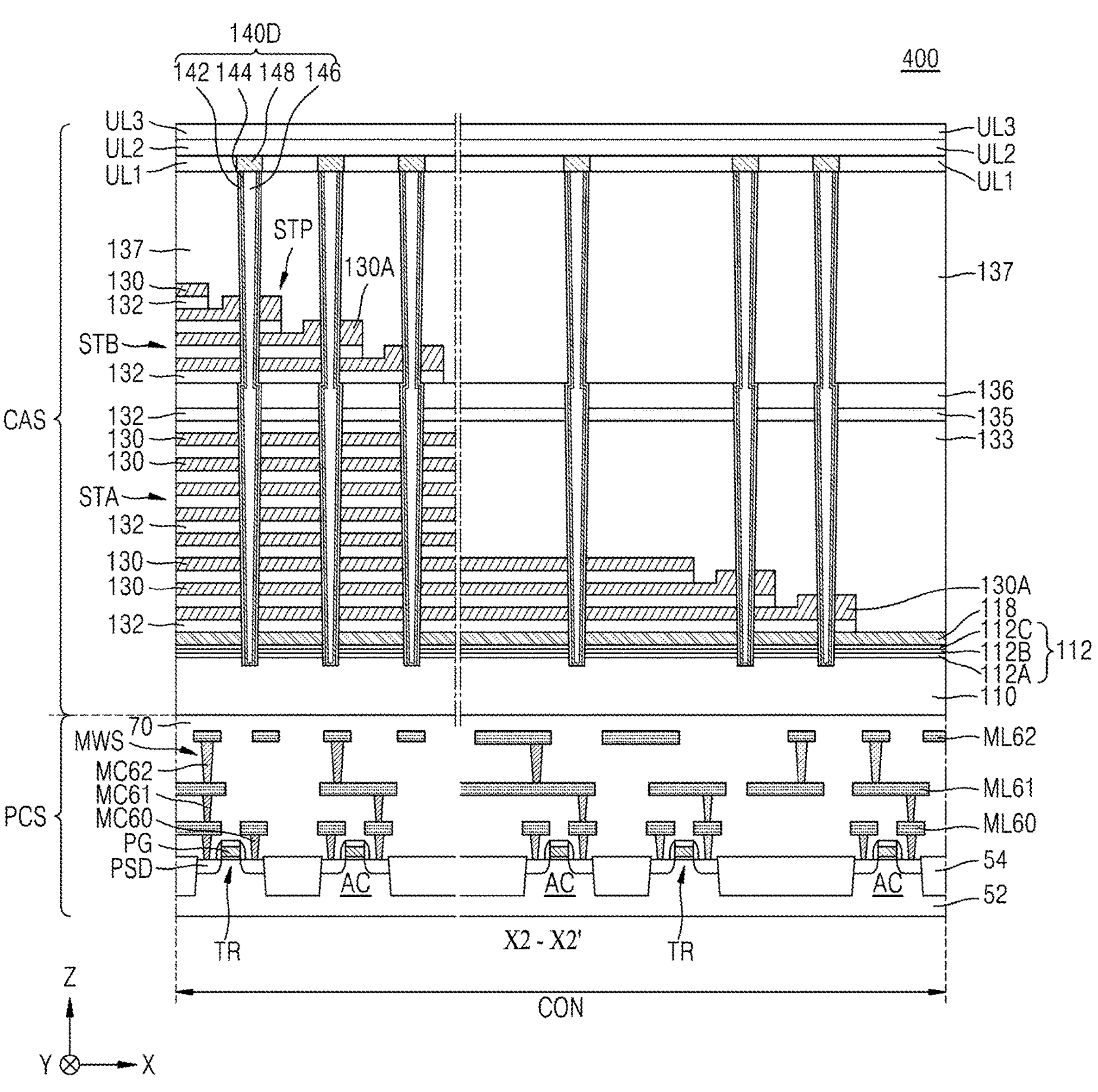
Figure 6C:
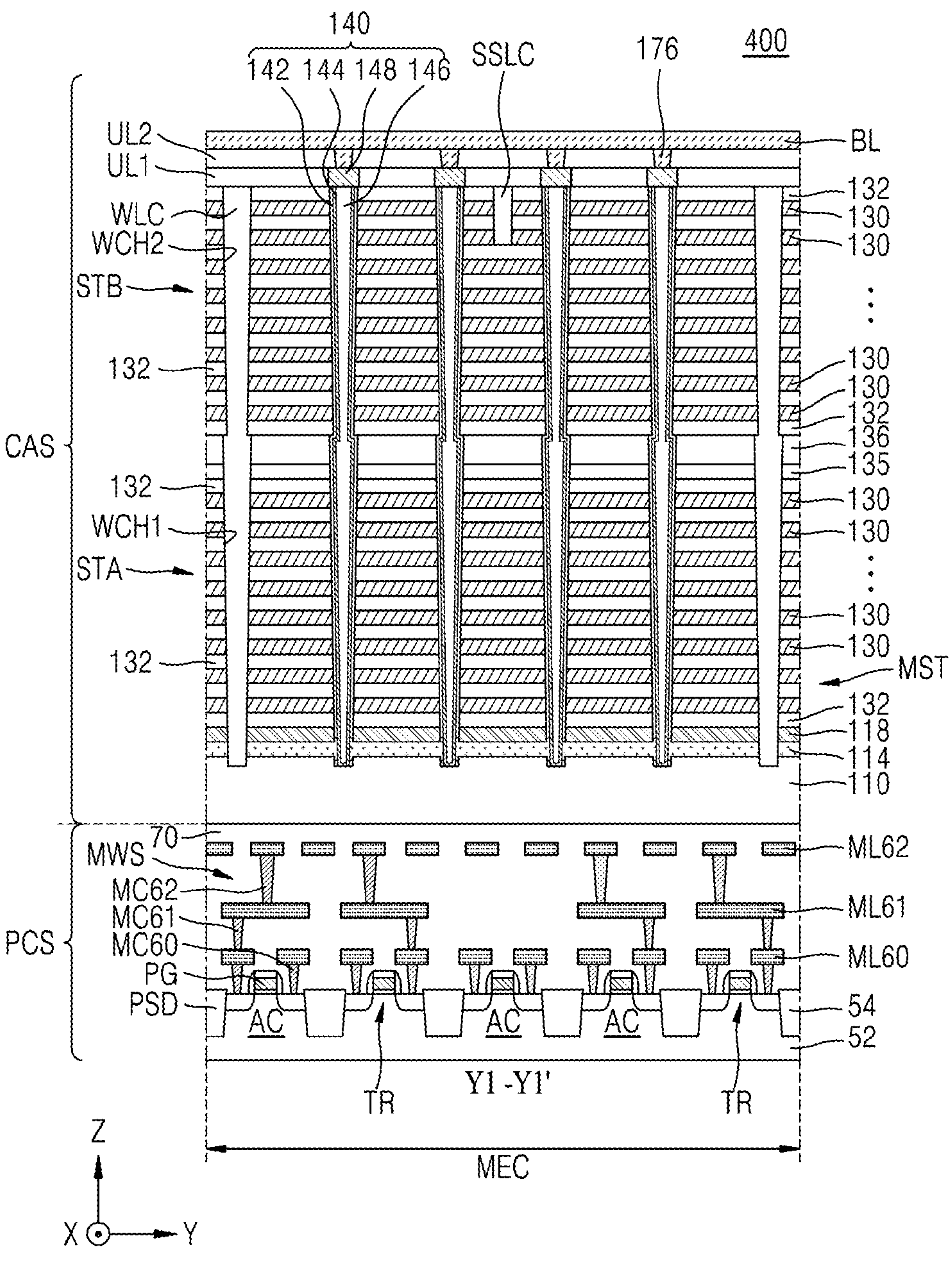

FIGS. 6A, 6B, and 6C are cross-sectional views illustrating an integrated circuit device 400 according to some embodiments, and in particular, FIG. 6A is a cross-sectional view of some components of a region corresponding to a cross-section taken along the line X1-X1' of FIG. 2, FIG. 6B is a cross-sectional view of some components of a region corresponding to a cross-section taken along the line X2-X2' of FIG. 2, and FIG. 6C is a cross-sectional view of some components of a region corresponding to a cross-section taken along the line Y1-Y1' of FIG. 2. In FIGS. 6A, 6B, and 6C, the same reference numerals as in FIGS. 3A to 3C respectively denote the same members, and here, repeated descriptions thereof may be omitted.

Referring to FIGS. 6A, 6B, and 6C, the integrated circuit device 400 may have substantially the same configuration as the integrated circuit device 100 described with reference to FIGS. 2 to 3D. In an implementation, the integrated circuit device 400 may include the cell array structure CAS and a peripheral circuit structure PCS, which overlap each other in the vertical direction (Z direction). The cell array structure CAS may have substantially the same configuration as described with reference to FIGS. 2 to 3D.

The peripheral circuit structure PCS may include a lower substrate 52, a plurality of peripheral circuits formed on the lower substrate 52, and a multilayer wiring structure MWS for connecting the plurality of peripheral circuits to each other or connecting the plurality of peripheral circuits to components in the memory cell area MEC.

The lower substrate 52 may include a semiconductor substrate. In an implementation, the lower substrate 52 may include Si, Ge, or SiGe. An active region AC may be defined in the lower substrate 52 by a device isolation film 54. A plurality of transistors TR constituting the plurality of peripheral circuits may each be formed on the active region AC. Each of the plurality of transistors TR may include a gate PG and a plurality of ion implantation regions PSD formed in the active region AC on both sides of the gate PG. Each of the plurality of ion implantation regions PSD may constitute a source region or a drain region of a transistor TR.

The plurality of peripheral circuits of the peripheral circuit structure PCS may include various circuits. In an implementation, the plurality of peripheral circuits of the peripheral circuit structure PCS may include a row decoder, a page buffer, a data input/output circuit, control logic, a common source line driver, or the like.

The multilayer wiring structure MWS of the peripheral circuit structure PCS may include a plurality of peripheral circuit wiring layers ML60, ML61, and ML62 and a plurality of peripheral circuit contacts MC60, MC61, and MC62. At least some of the plurality of peripheral circuit wiring layers ML60, ML61, and ML62 may each be electrically connectable to the transistor TR. The plurality of peripheral circuit contacts MC60, MC61, and MC62 may connect some selected from the plurality of transistors TR and the plurality of peripheral circuit wiring layers ML60, ML61, and ML62 to each other.

In an implementation, as illustrated in FIGS. 6A, 6B, and 6C, the multilayer wiring structure MWS may have three wiring layers in the vertical direction (Z direction). In an implementation, the multilayer wiring structure MWS may have two wiring layers or have four or more wiring layers.

The plurality of peripheral circuit wiring layers ML60, ML61, and ML62 and the plurality of peripheral circuit contacts MC60, MC61, and MC62 may each include a metal, a conductive metal nitride, a metal silicide, or a combination thereof. In an implementation, the plurality of peripheral circuit wiring layers ML60, ML61, and ML62 and the plurality of peripheral circuit contacts MC60, MC61, and MC62 may each include a conductive material, such as tungsten, molybdenum, titanium, cobalt, tantalum, nickel, tungsten silicide, titanium silicide, cobalt silicide, tantalum silicide, or nickel silicide.

The plurality of transistors TR and the multilayer wiring structure MWS, which are included in the peripheral circuit structure PCS, may be covered by an interlayer dielectric 70. The interlayer dielectric 70 may include silicon oxide, SiON, SiOCN, or the like.

As shown in FIGS. 6A and 6B, in the connection area CON of the cell array structure CAS, the substrate 110 may be on the peripheral circuit structure PCS, and the insulating plate 112, the second conductive plate 118, the first stack STA, and the second stack STB may be stacked in the stated order on the substrate 110.

As shown in FIG. 6C, in the memory cell area MEC of the cell array structure CAS, the substrate 110 may be on the peripheral circuit structure PCS, and the first conductive plate 114, the second conductive plate 118, the first stack STA, and the second stack STB may be stacked in the stated order on the substrate 110.

As shown in FIG. 6A, in a portion of the connection area CON, a plurality of through-openings 420H may be formed through the substrate 110, the insulating plate 112, and the second conductive plate 118. Each of the plurality of through-openings 420H may be filled with an insulating plug 420. The plurality of through-openings 420H may overlap a portion of the peripheral circuit structure PCS in the vertical direction (Z direction). The insulating plug 420 may include a silicon oxide film, a silicon nitride film, or a combination thereof.

In the connection area CON, each of the plurality of through-electrodes THV may extend to the peripheral circuit structure PCS via a through-opening 420H and be configured to be electrically connected to one wiring layer selected from the plurality of peripheral circuit wiring layers ML60, ML61, and ML62. In an implementation, each of the plurality of through-electrodes THV may be electrically connected to the uppermost peripheral circuit wiring layer ML62, which is closest to the cell array structure CAS, from among the peripheral circuit wiring layers ML60, ML61, and ML62. Each of the plurality of through-electrodes THV may be connected to at least one peripheral circuit selected from the plurality of peripheral circuits via the multilayer wiring structure MWS of the peripheral circuit structure PCS.

Each of the integrated circuit devices 200, 300, and 400 shown in FIGS. 4 to 6C may provide the same effects as described regarding the integrated circuit device 100 shown in FIGS. 2 and 3A to 3D.

FIGS. 7A to 13C are cross-sectional views of stages in a method of manufacturing an integrated circuit device, according to some embodiments. In particular, FIGS. 7A, 8A, 9A, 10A, 11A, 12A, and 13A are cross-sectional views each illustrating some components in a region corresponding to the cross-section taken along the line X1-X1' of FIG. 2 according to a sequence of processes, FIGS. 7B, 8B, 9B, 10B, 111B, 12B, and 13B are cross-sectional views each illustrating some components in a region corresponding to the cross-section taken along the line X2-X2' of FIG. 2 according to the sequence of processes, and FIGS. 7C, 10C, 11C, 12C, and 13C are cross-sectional views each illustrating some components in a region corresponding to the cross-section taken along the line Y1-Y1' of FIG. 2 according to the sequence of processes. An example of a method of manufacturing the integrated circuit device 100 shown in FIGS. 2 to 3D is described with reference to FIGS. 7A to 13C.

Figure 7A:
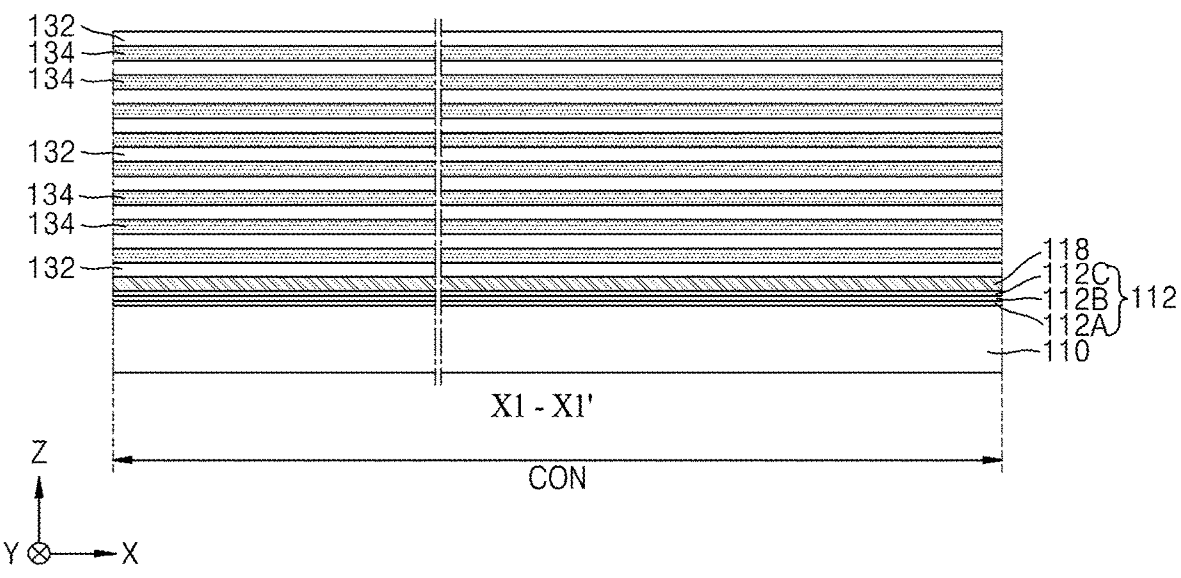
Figure 7B:
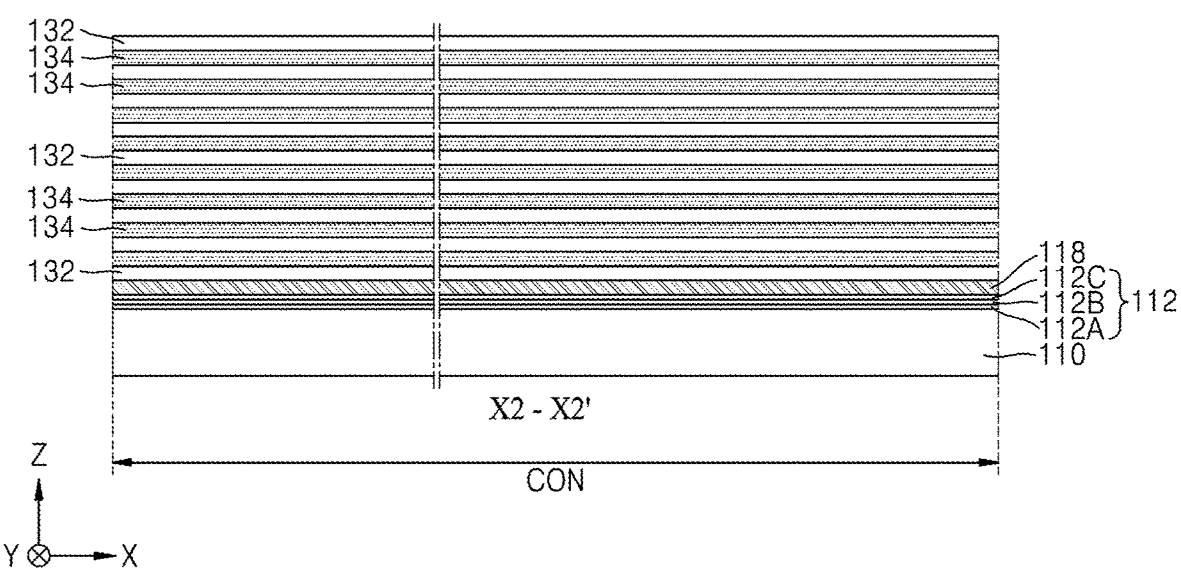
FIGS. 7B, 8B, 9B, 10B, 11B, 12B, and 13B are cross-sectional views each illustrating some components in a region corresponding to the cross-section taken along the line X2-X2' of FIG. 2 according to the sequence of processes.
Figure 7C:
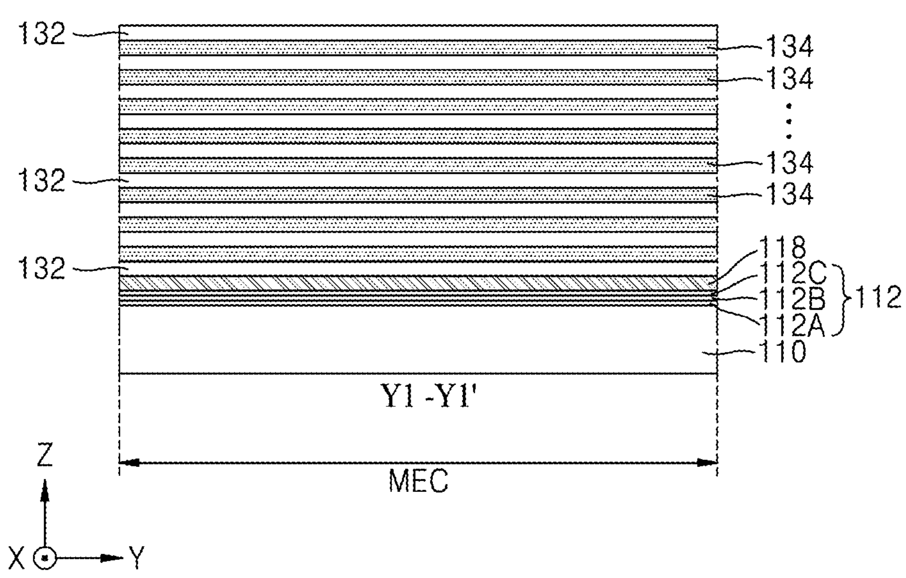

Referring to FIGS. 7A, 7B, and 7C, in the memory cell area MEC and the connection area CON, the insulating plate 112 and the second conductive plate 118 may be formed in the stated order on the substrate 110. The insulating plate 112 may include an insulating film having a multilayer structure, which includes the first insulating film 112A, the second insulating film 112B, and the third insulating film 112C.

In the memory cell area MEC and the connection area CON, the plurality of insulating films 132 and the plurality of sacrificial insulating films 134 may be alternately stacked one by one on the second conductive plate 118. The plurality of insulating films 132 may each include a silicon oxide film, and the plurality of sacrificial insulating films 134 may each include a silicon nitride film. The plurality of sacrificial insulating films 134 may function to respectively secure spaces for forming the plurality of gate lines 130 in a subsequent process.

Figure 8A:
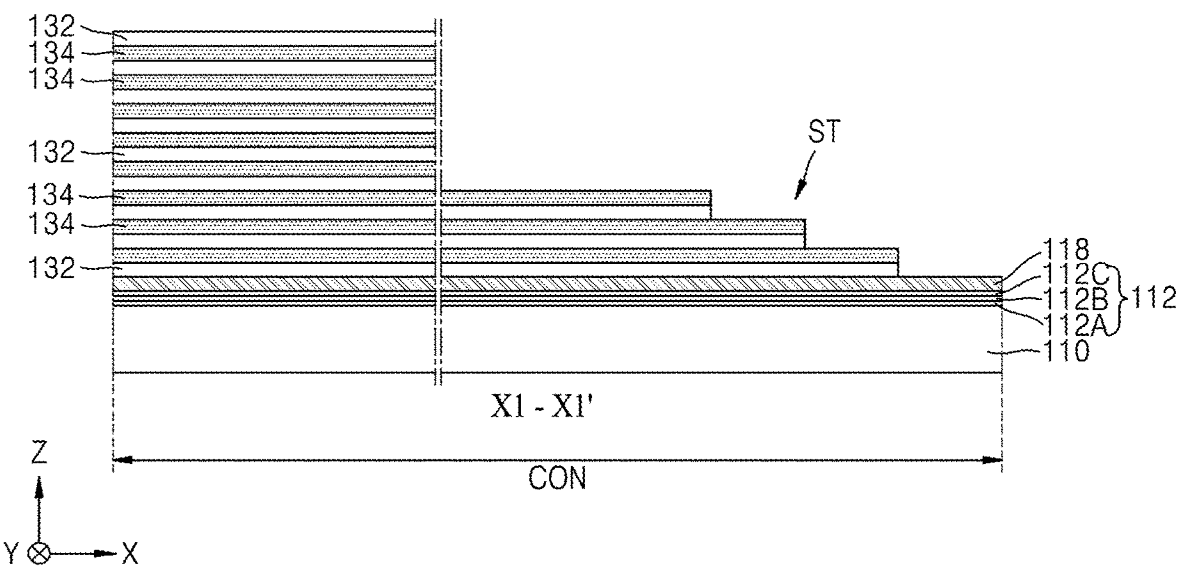
Figure 8B:
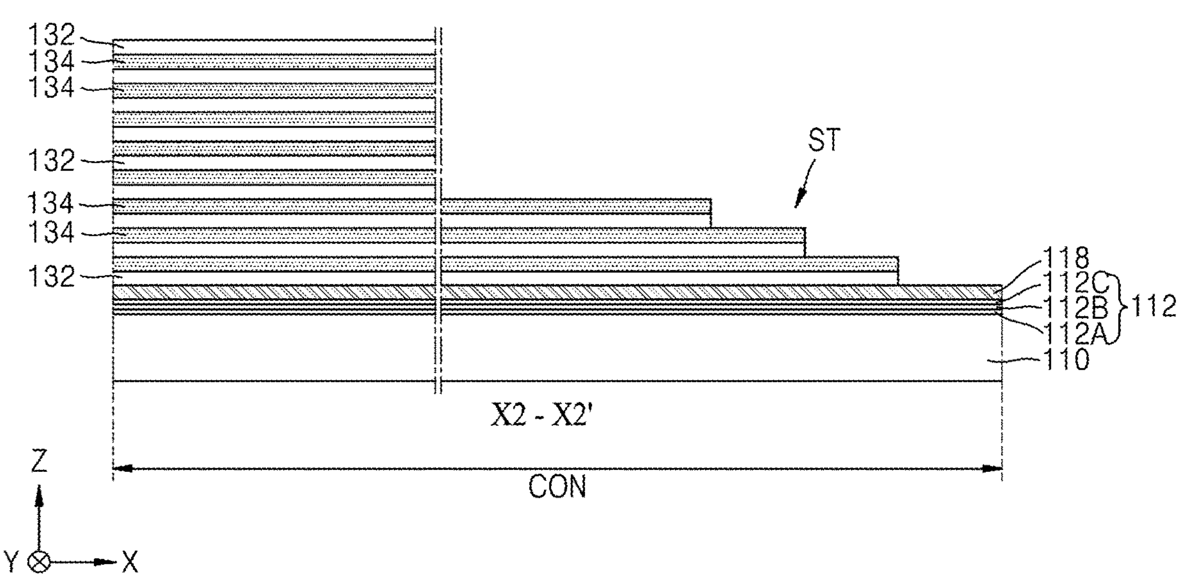

Referring to FIGS. 8A and 8B, in a resulting product of FIGS. 7A, 7B, and 7C, an etch stop film may be formed to cover an uppermost insulating film 132 from among the plurality of insulating films 132, followed by removing a portion of each of the plurality of insulating films 132 and the plurality of sacrificial insulating films 134 in the connection area CON by a photolithography process, thereby forming a step structure ST in which one-side ends of the plurality of insulating films 132 and the plurality of sacrificial insulating films 134 respectively have gradually decreasing widths in a horizontal direction with increasing distances from the substrate 110.

Figure 9A:
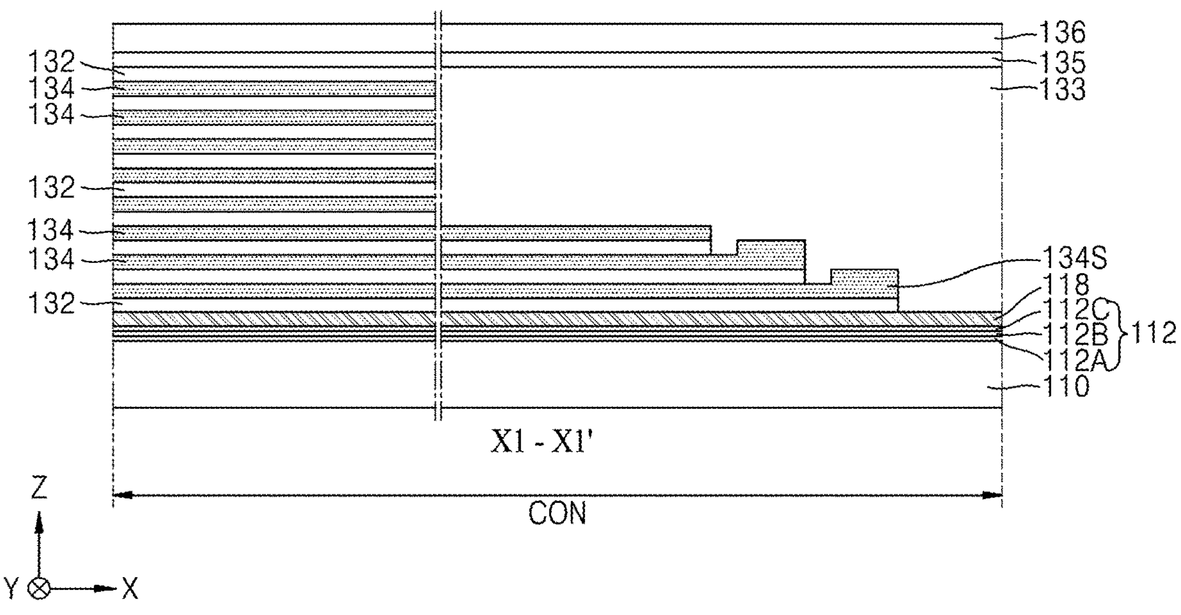
Figure 9B:
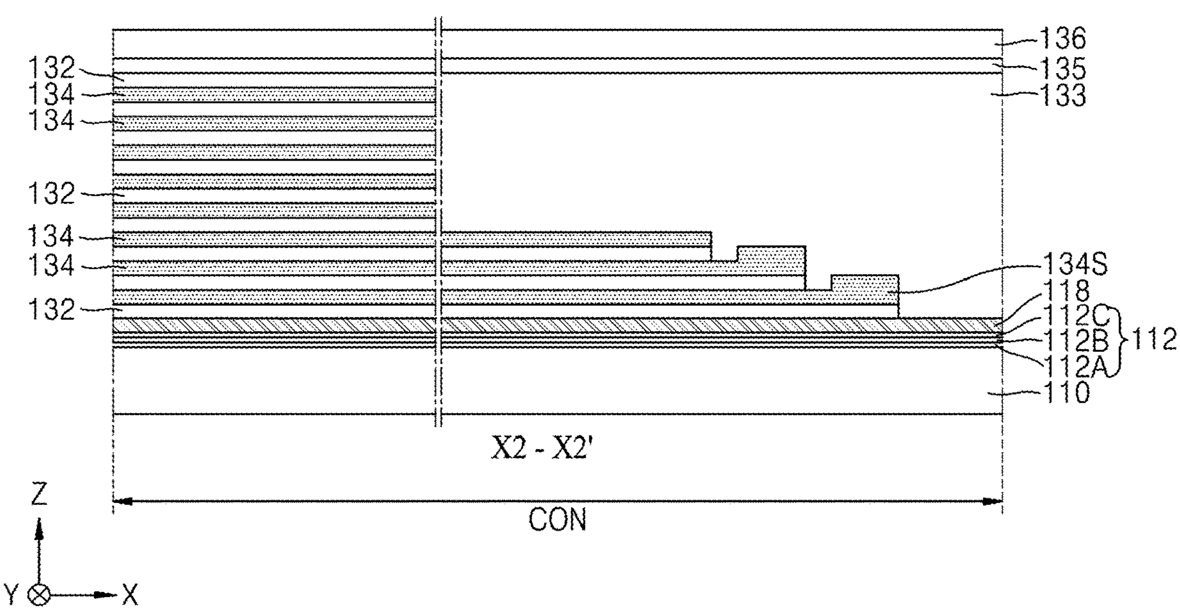

Referring to FIGS. 9A and 9B, in a resulting product of FIGS. 8A and 8B, a sacrificial pad portion 134S having an increased thickness may be formed at the one-side end of each of the plurality of sacrificial insulating films 134 constituting the stack structure ST.

In an implementation, to form the sacrificial pad portion 134S at the one-side end of each of the plurality of sacrificial insulating films 134, the one-side end of each of the plurality of sacrificial insulating films 134 constituting the stack structure ST may be exposed by removing portions of the plurality of insulating films 132, followed by depositing additional film including the same material as a constituent material of each of the plurality of sacrificial insulating films 134 on the exposed one-side end of each of the plurality of sacrificial insulating films 134, and then, the additional film may be patterned, thereby leaving the sacrificial pad portion 134S.

Next, the lower insulating block 133 may be formed to cover the step structure ST and the second conductive plate 118, and unnecessary films may be removed by planarizing a resulting product obtained as a result thereof by a chemical mechanical polishing (CMP) process, thereby exposing an upper surface of the uppermost insulating film 132.

A detailed description of a constituent material of the lower insulating block 133 is the same as given with reference to FIGS. 3A and 3B. In an implementation, to form the lower insulating block 133, the same process as described regarding process P10 of FIG. 1 may be used. In an implementation, to form the lower insulating block 133, a PECVD process may be performed by using a silicon precursor including a compound of Formulae 1 to 6, an oxidant, and at least two dopant sources including different dopant elements from each other, thereby forming a doped silicon oxide film including at least two dopant elements. While the PECVD process is performed, an in-situ doping process, in which the dopant sources are supplied together therewith, may be performed, thereby forming the doped silicon oxide film.

Next, the first intermediate insulating film 135 and the second intermediate insulating film 136 may be formed in the sated order to cover an upper surface of each of the uppermost insulating film 132 and the lower insulating block 133. In some embodiments, to form the first intermediate insulating film 135 and the second intermediate insulating film 136, similar processes to the description made regarding the process of forming the lower insulating block 133 may be performed.

Figure 10A:
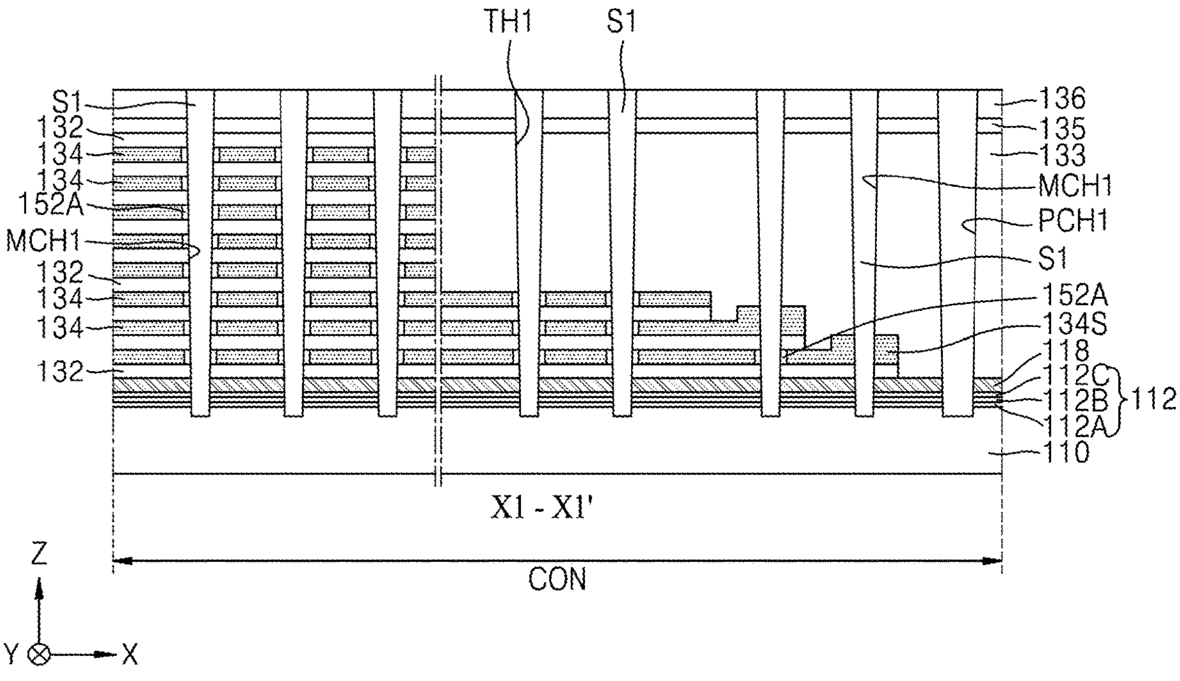
Figure 10B:
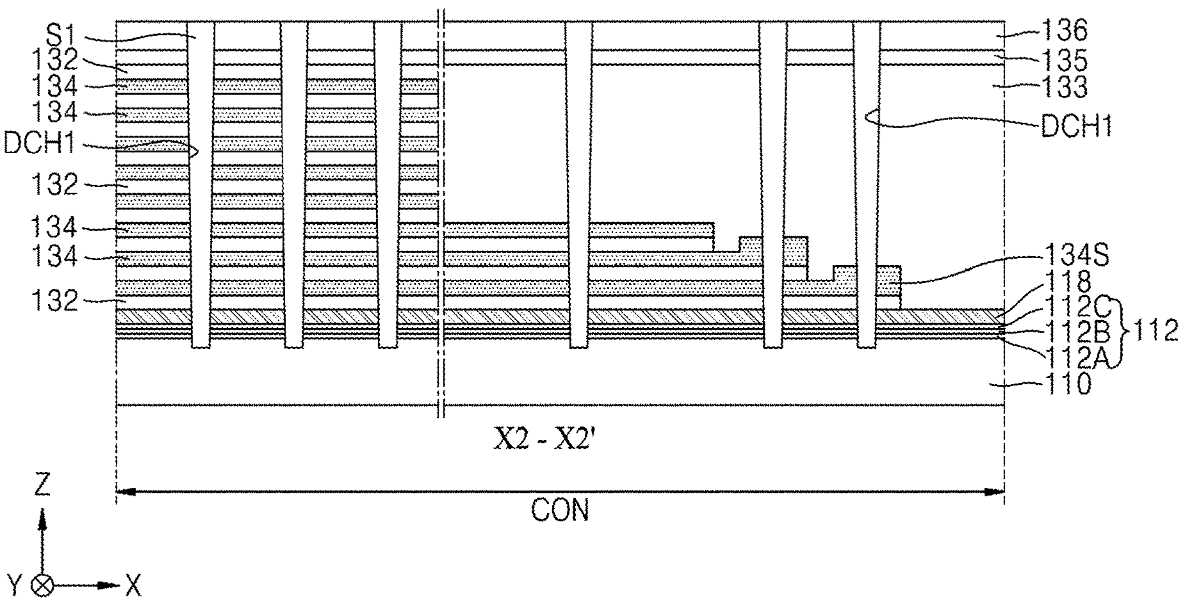
Figure 10C:
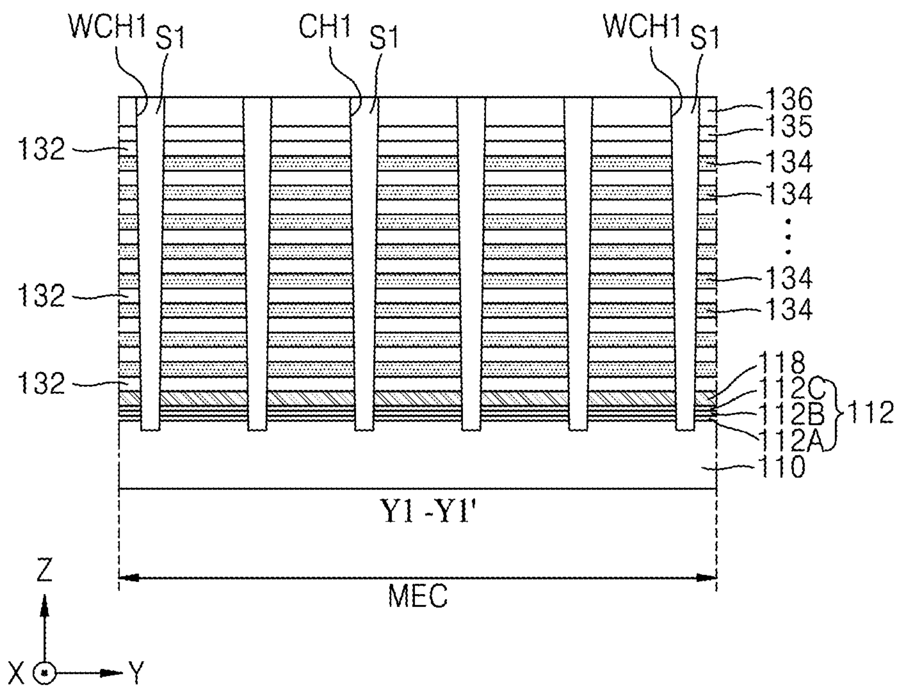

Referring to FIGS. 10A, 10B, and 10C, in the connection area CON and the memory cell area MEC, a plurality of lower vertical holes may be simultaneously formed by dry-etching the second intermediate insulating film 136, the first intermediate insulating film 135, the lower insulating block 133, the stack structure of the plurality of insulating films 132 and the plurality of sacrificial insulating films 134, the second conductive plate 118, and the insulating plate 112. The plurality of lower vertical holes may include a plurality of lower memory cell contact holes MCH1, a lower plate contact hole PCH1, a plurality of lower dummy channel holes DCH1, and a plurality of lower through-holes TH1, which are arranged in the connection area CON, and also include a plurality of lower channel holes CH1 and a plurality of lower word line cut holes WCH1, which are arranged in the memory cell area MEC. In an implementation, the plurality of lower vertical holes may further include a plurality of lower holes required to form the plurality of insulating support structures SP shown in FIG. 2.

Next, as shown in FIG. 10A, by partially etching the sacrificial pad portion 134S and the sacrificial insulating film 134, which are exposed in each of the plurality of lower memory cell contact holes MCH1 and the plurality of lower through-holes TH1, a horizontal width of each of the plurality of lower memory cell contact holes MCH1 and the plurality of lower through-holes TH1, at the same vertical level as the sacrificial insulating film 134, may be enlarged, thereby forming a plurality of indent spaces to expose sidewalls of the sacrificial pad portion 134S and the sacrificial insulating film 134. Next, among the plurality of indent spaces, an indent space exposing the sacrificial insulating film 134 may be filled with the first insulating ring 152A, and an indent space exposing the sacrificial pad portion 134S may be filled again with the sacrificial pad portion 134S. Next, a plurality of first sacrificial films Si may be formed to respectively fill the plurality of lower vertical holes. In an implementation, each of the plurality of first sacrificial films Si may include, e.g., a silicon oxide film, a polysilicon film, a carbon film, or a tungsten film.

Figure 11A:
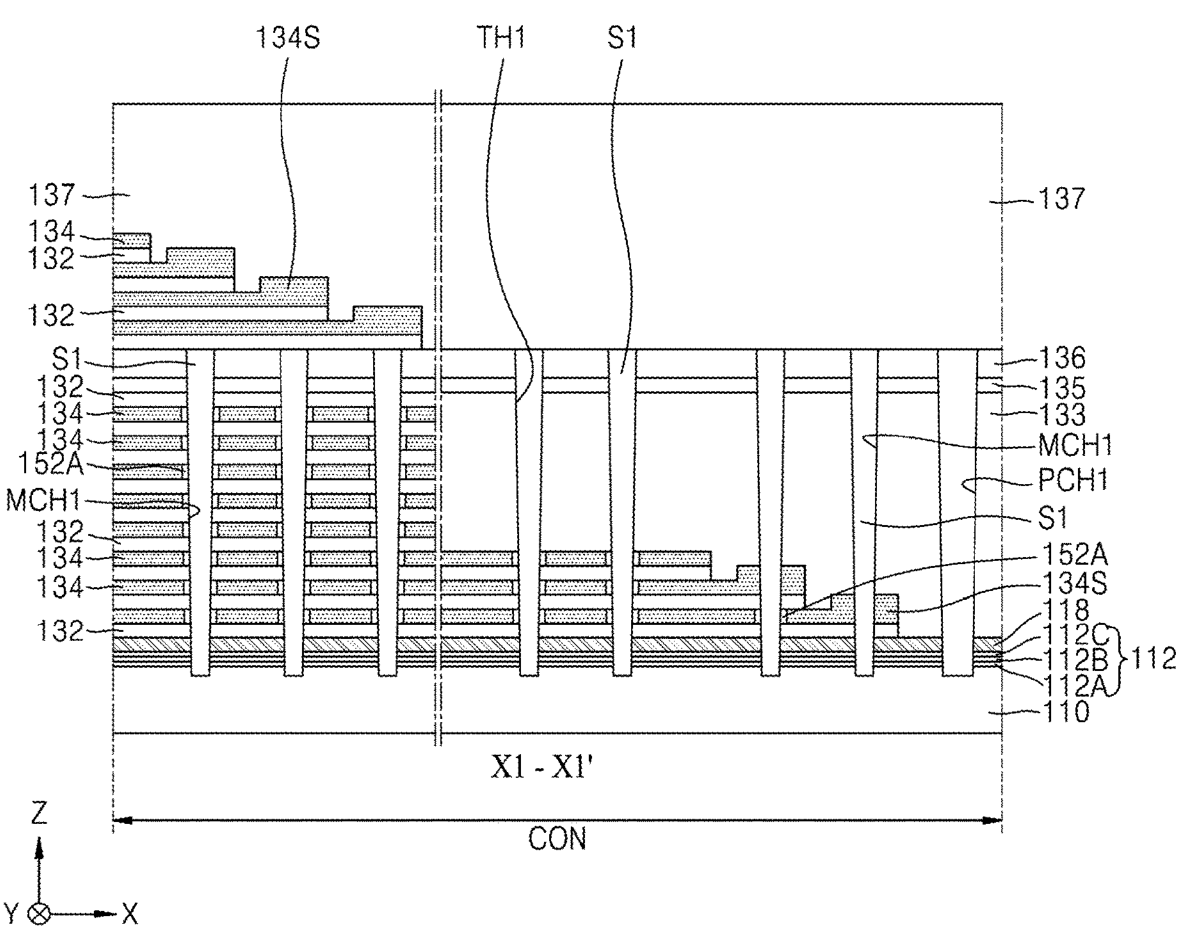
Figure 11B:
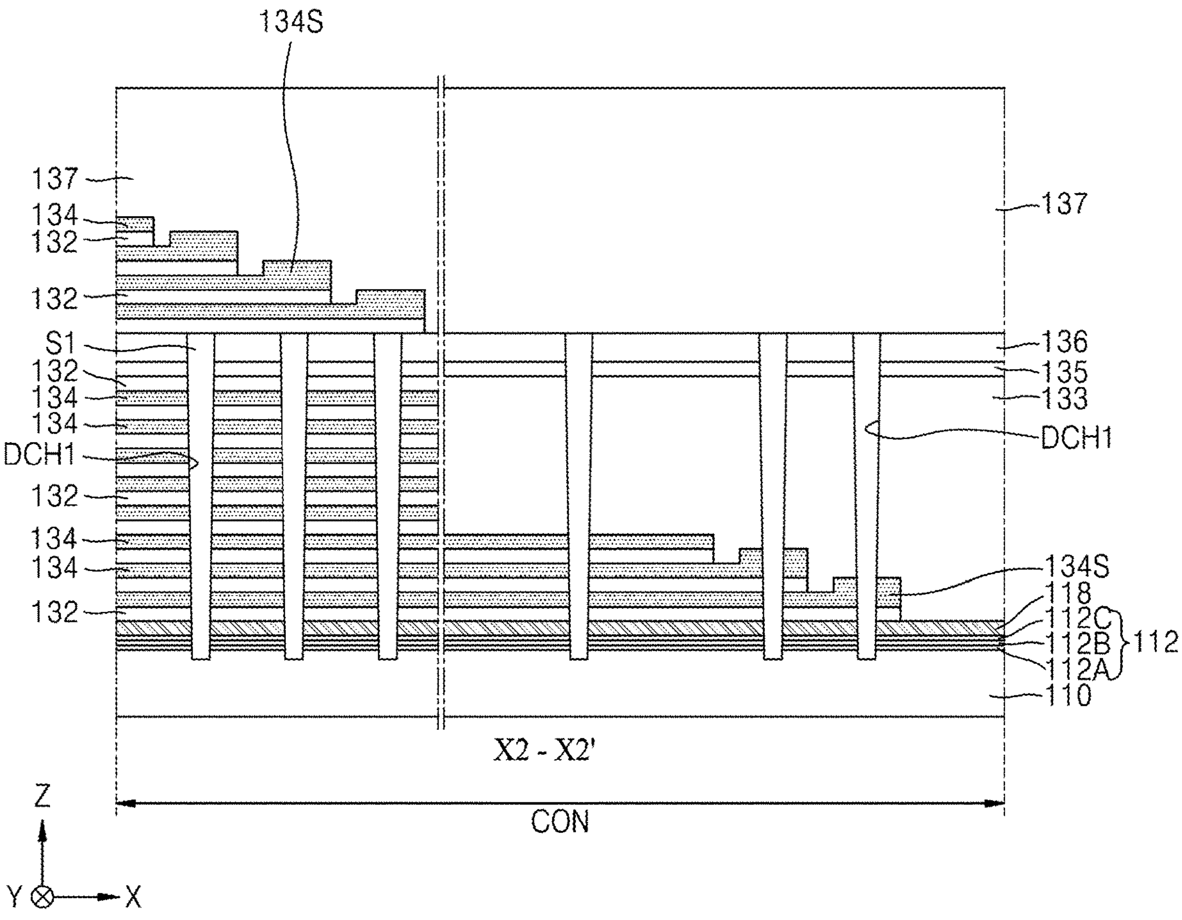
Figure 11C:
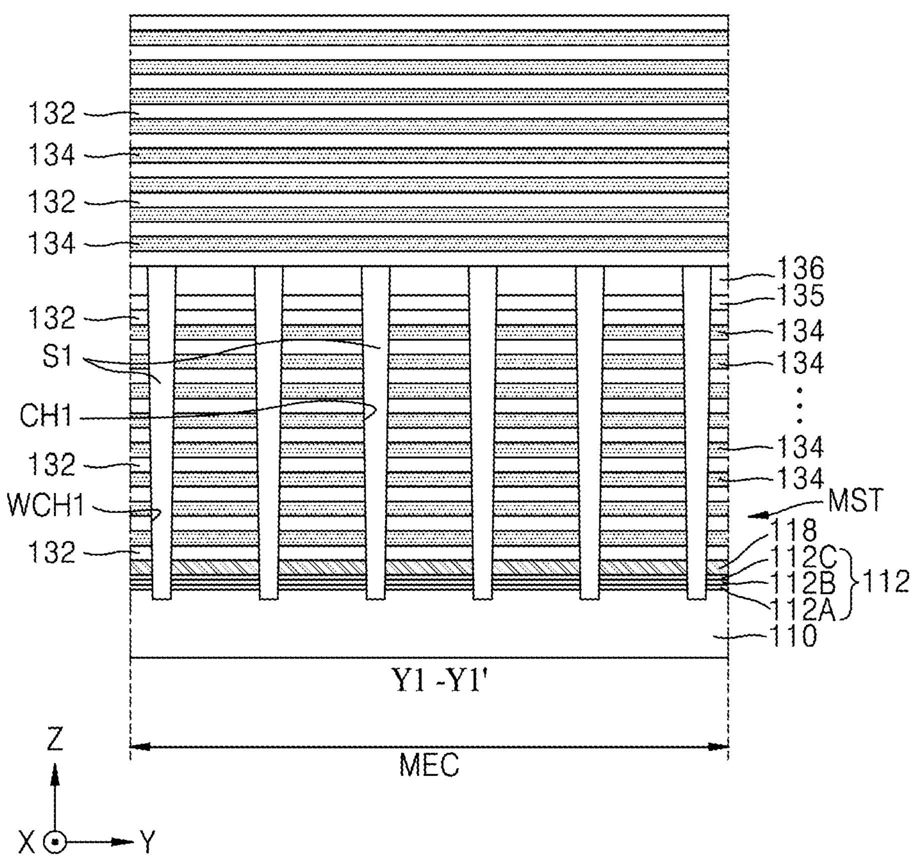

Referring to FIGS. 11A, 11B, and 11C, in a resulting product of FIGS. 10A, 10B, and 10C, by performing similar processes to the descriptions made with reference to FIGS. 7A to 8B, a structure including the plurality of insulating films 132, the plurality of sacrificial insulating films 134, and a plurality of sacrificial pad portions 134S, which are required to form the second stack STB (see FIGS. 3A to 3C), may be formed on the second intermediate insulating film 136, and the upper insulating block 137 may be formed to cover the structure in the connection area CON.

To form the upper insulating block 137, a similar process to the description made regarding the process of forming the lower insulating block 133 with reference to FIGS. 9A and 9B may be performed. In an implementation, the upper insulating block 137 may include the same material as the lower insulating block 133.

Figure 12A:
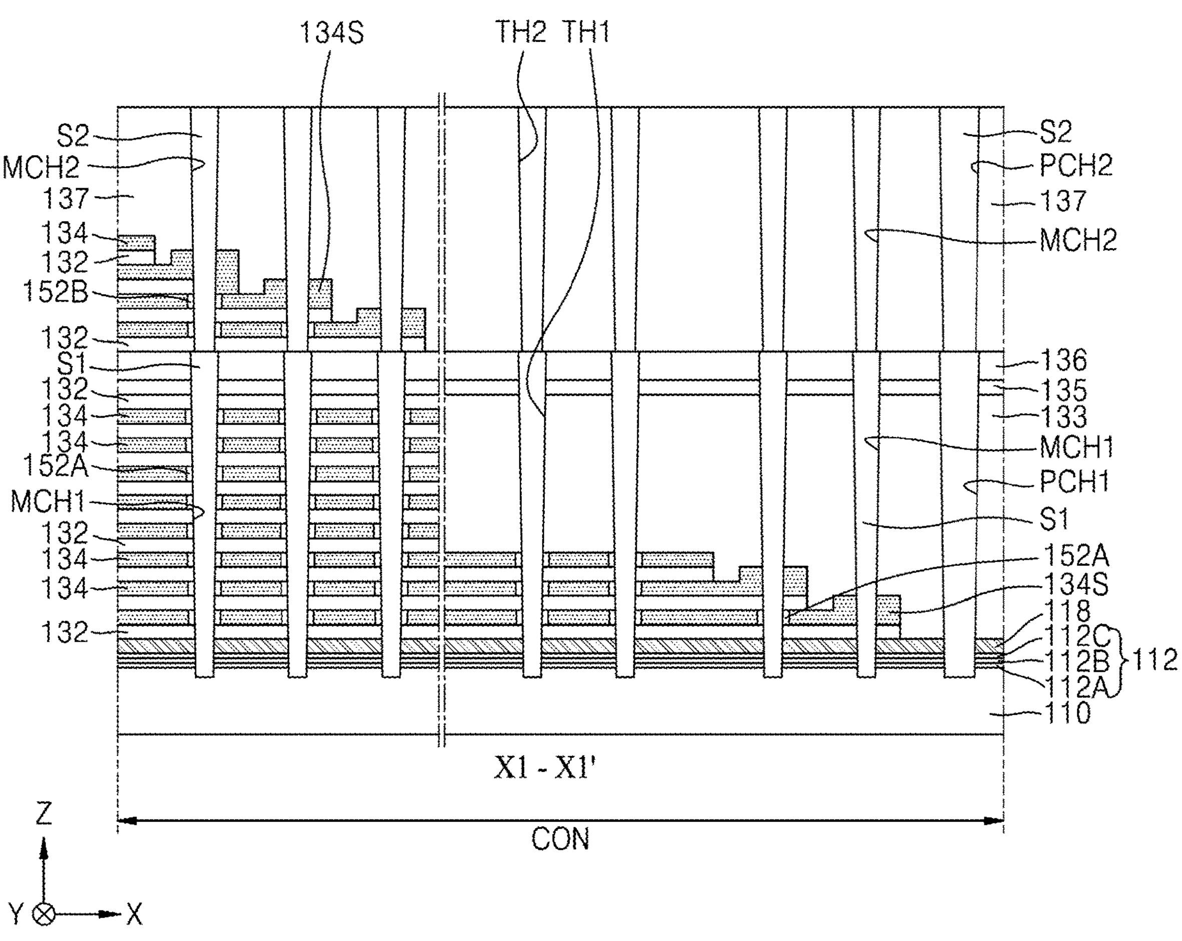
Figure 12B:
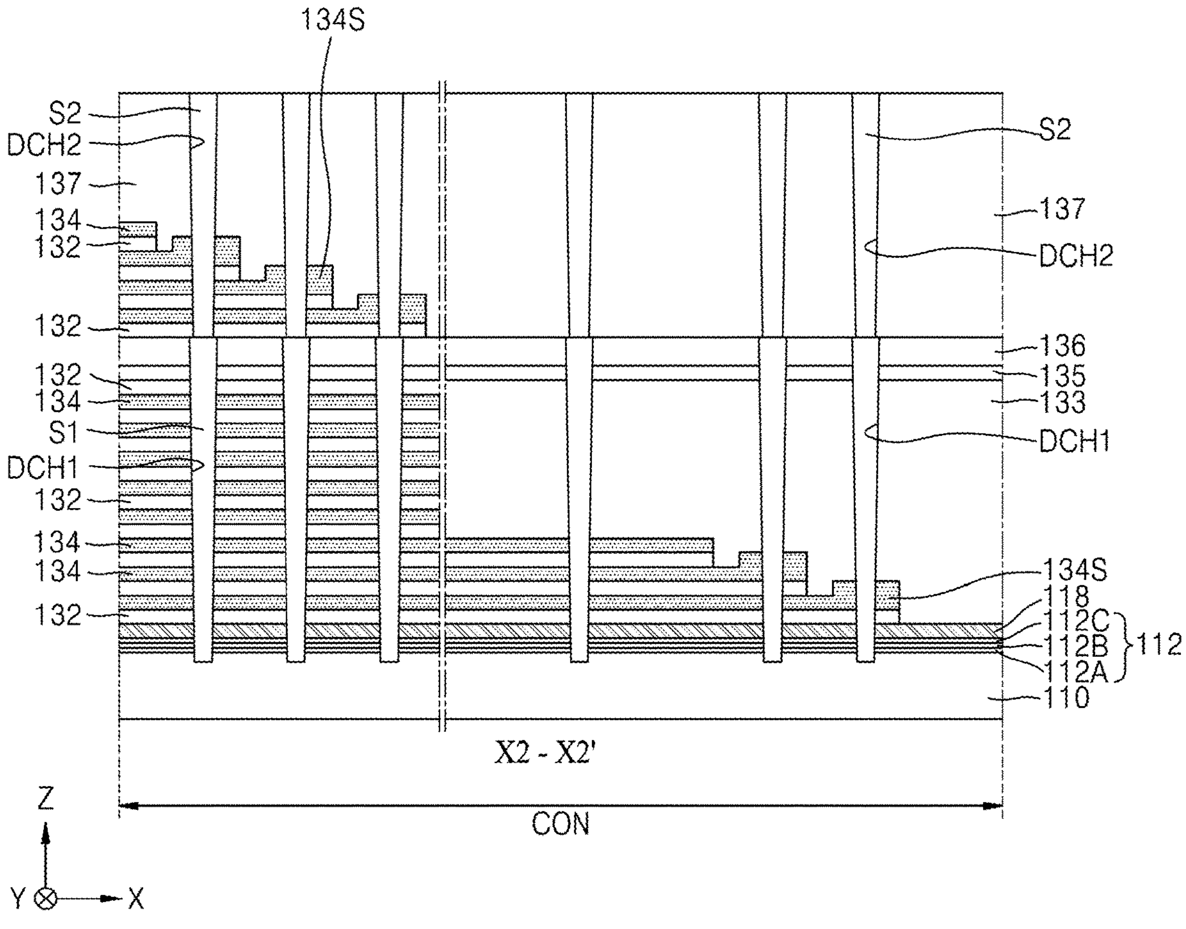
Figure 12C:
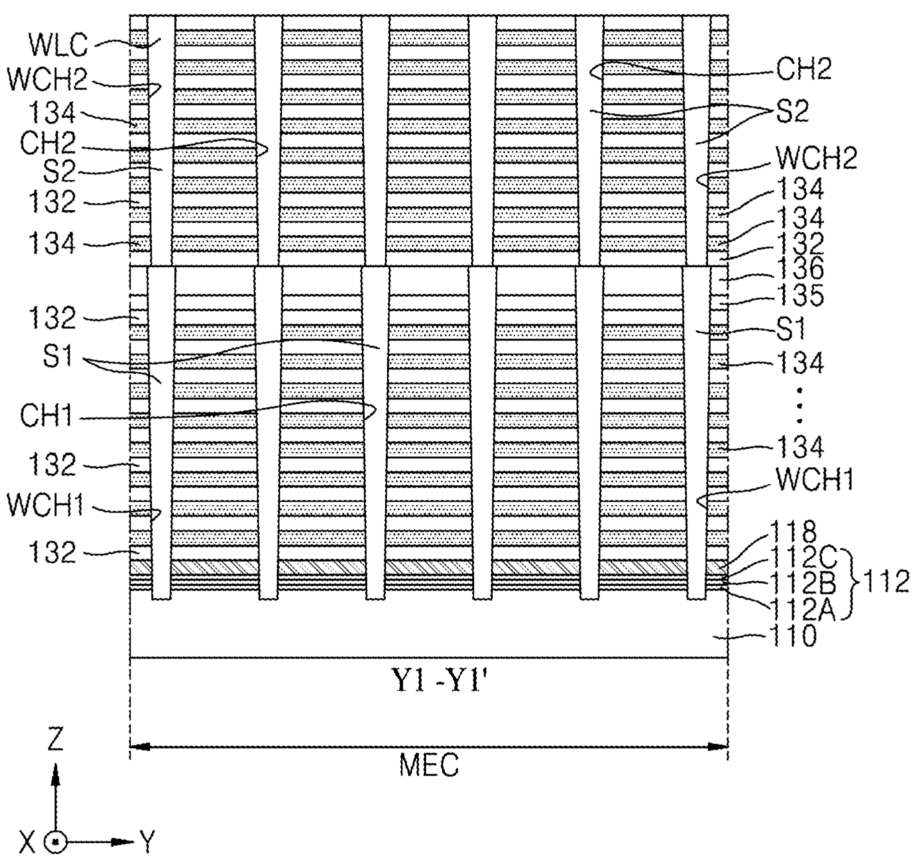

Referring to FIGS. 12A, 12B, and 12C, in the connection area CON and the memory cell area MEC of a resulting product of FIGS. 11A, 11B, and 11C, the structure including the plurality of insulating films 132, the plurality of sacrificial insulating films 134, and the plurality of sacrificial pad portions 134S, which are required to form the second stack STB (see FIGS. 3A to 3C), may be dry-etched, thereby simultaneously forming a plurality of upper vertical holes, which are respectively connected to the plurality of lower vertical holes. The plurality of upper vertical holes may include a plurality of upper memory cell contact holes MCH2, an upper plate contact hole PCH2, a plurality of upper dummy channel holes DCH2, and a plurality of upper through-holes TH2, which are arranged in the connection area CON, and also include a plurality of upper channel holes CH2 and a plurality of upper word line cut holes WCH2, which are arranged in the memory cell area MEC. In an implementation, the plurality of upper vertical holes may further include a plurality of upper holes required to form the plurality of insulating support structures SP shown in FIG. 2.

Next, a plurality of second insulating rings 152B may be formed by a similar method to the description made regarding the process of forming a plurality of first insulating rings 152A with reference to FIGS. 10A, 10B, and 10C, and a plurality of second sacrificial films S2 may be formed to respectively fill the plurality of upper vertical holes. In an implementation, each of the plurality of second sacrificial films S2 may include the same material as each of the plurality of first sacrificial films S1.

Figure 13A:
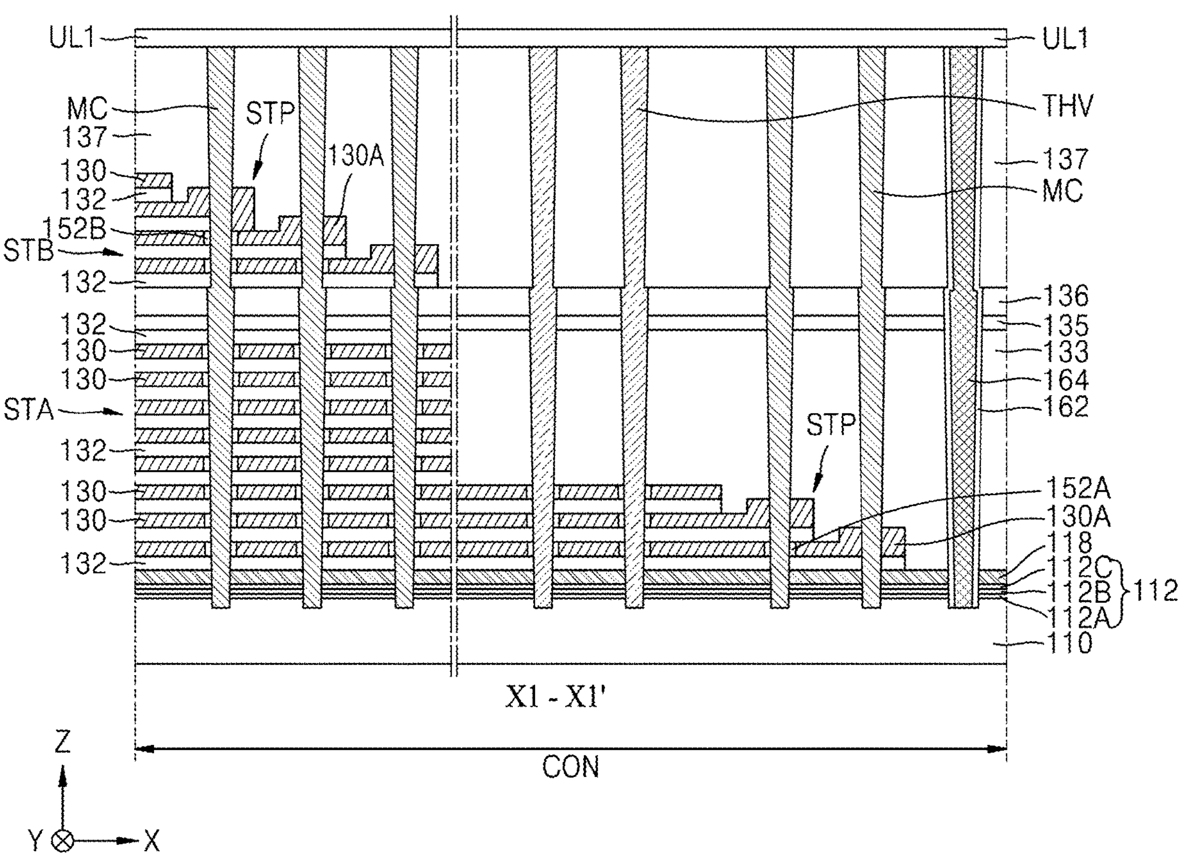
Figure 13B:
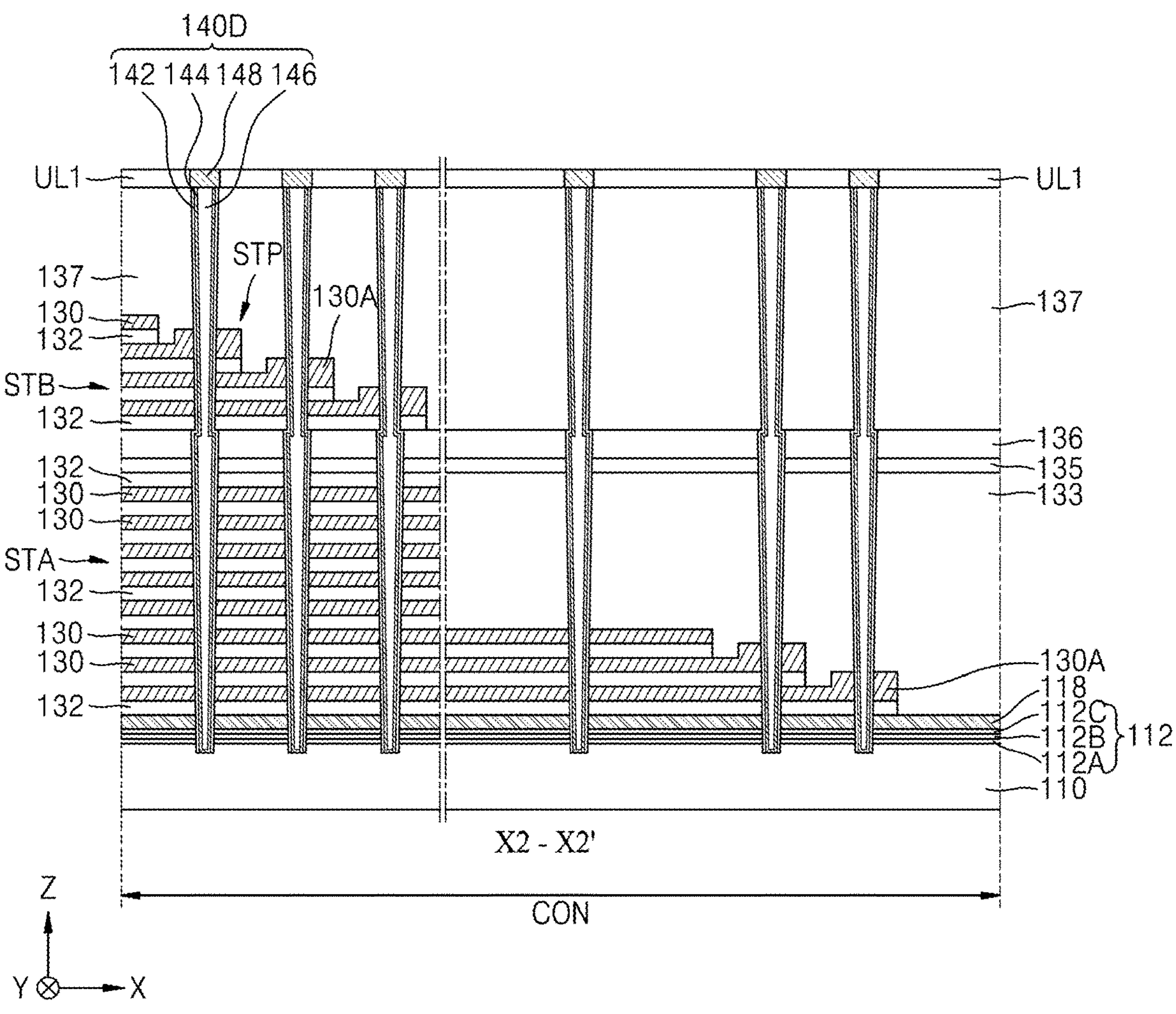
Figure 13C:
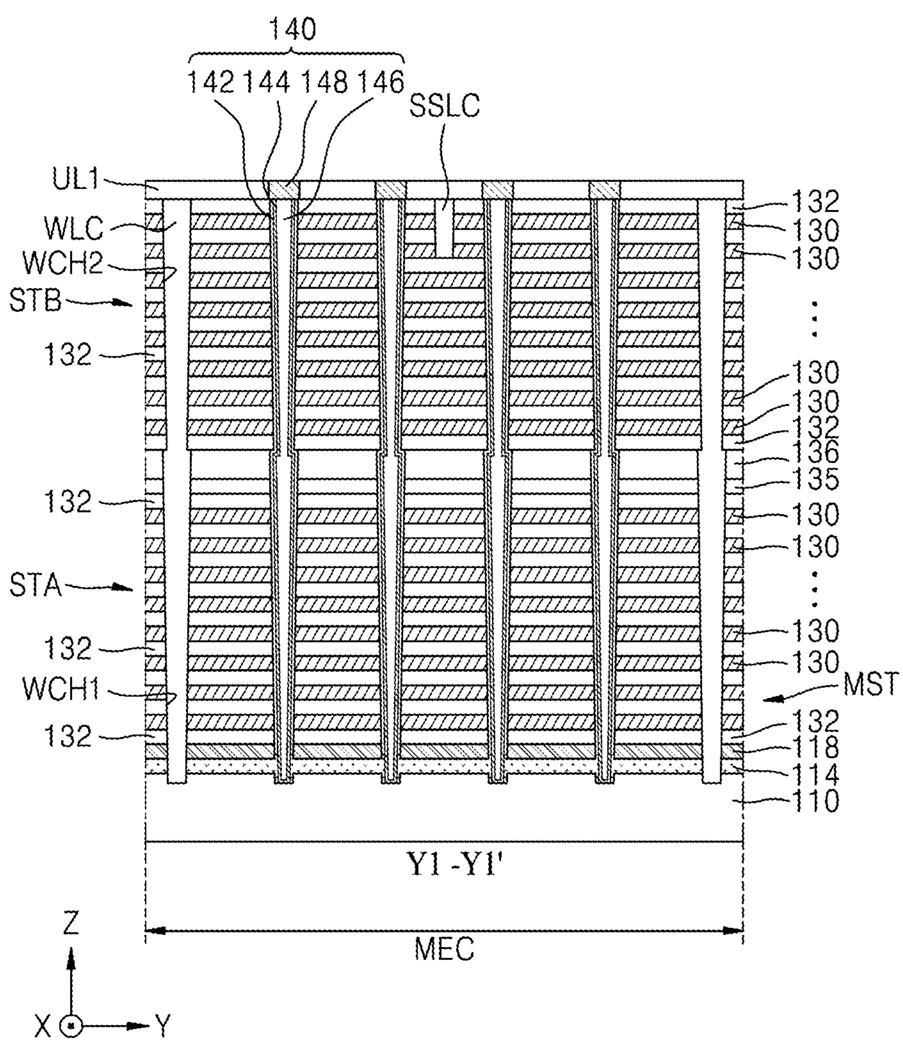

Referring to FIGS. 13A, 13B, and 13C, in a resulting product of FIGS. 12A, 12B, and 12C, the plurality of first sacrificial films S1 and the plurality of second sacrificial films S2 may be respectively and sequentially substituted with a plurality of plug structures, which include the plurality of memory cell contacts MC, the plurality of insulating support structures SP, the plurality of through-electrodes THV, the plurality of channel structures 140, the plurality of dummy channel structures 140D, the plurality of word line cut structures WLC, the string select line cut structure SSLC, the conductive plate contact 164, and the insulating spacer 162 surrounding the conductive plate contact 164, and the first upper insulating film UL1 may be formed to cover the plurality of plug structures in the connection area CON and the memory cell area MEC. The order of forming each of the plurality of memory cell contacts MC, the plurality of insulating support structures SP, the plurality of through-electrodes THV, the plurality of channel structures 140, the plurality of dummy channel structures 140D, the plurality of word line cut structures WLC, the string select line cut structure SSLC, the conductive plate contact 164, and the insulating spacer 162 may be variously selected, as needed.

In an implementation, after the plurality of channel structures 140 and the plurality of dummy channel structures 140D are formed, and before the plurality of word line cut structures WLC are formed, the plurality of first sacrificial films S1 and the plurality of second sacrificial films S2, which respectively fill the plurality of lower word line cut holes WCH1 and the plurality of upper word line cut holes WCH2, may be removed, followed by selectively removing the insulating plate 112 through the plurality of lower word line cut holes WCH1 and the plurality of upper word line cut holes WCH2 only in the memory cell area MEC out of the memory cell area MEC and the connection area CON, and then, an empty space formed as a result thereof may be filled with the first conductive plate 114. While the insulating plate 112 in the memory cell area MEC is removed, portions of the gate dielectric film 142, which are adjacent to the insulating plate 112, in the channel structure 140 may be removed together with the insulating plate 112, and as a result, the first conductive plate 114 may pass through a portion of the gate dielectric film 142 in a horizontal direction to be in contact with the channel region 144.

In an implementation, after the first conductive plate 114 is formed, and before the plurality of word line cut structures WLC are formed, the plurality of sacrificial insulating films 134 and the plurality of sacrificial pad portions 134S (see FIGS. 12A and 12B) in the memory cell area MEC and the connection area CON may be respectively substituted with the plurality of gate lines 130 and the plurality of conductive pad portions 130A through the plurality of lower word line cut holes WCH1 and the plurality of upper word line cut holes WCH2. After the first conductive plate 114 and the plurality of gate lines 130 are formed, the plurality of word line cut structures WLC may be formed to respectively fill the plurality of lower word line cut holes WCH1 and the plurality of upper word line cut holes WCH2.

Next, the second upper insulating film UL2 may be formed to cover the first upper insulating film UL1 and the plurality of drain regions 148 on the resulting product of FIGS. 12A, 12B, and 12C, followed by forming the plurality of contact plugs 172 through the first upper insulating film UL1 and the second upper insulating film UL2 in the connection area CON, and then, the plurality of upper wiring layers UML may be formed on the second upper insulating film UL2 and the plurality of contact plugs 172 in the connection area CON. In addition, the plurality of contact plugs 176 may be formed through the second upper insulating film UL2 in the memory cell area MEC and thus respectively connected to the drain regions 148 of the plurality of channel structures 140, followed by forming the plurality of bit lines BL on the second upper insulating film UL2 to be connected to the plurality of contact plugs 176, and then, the third upper insulating film UL3 may be formed to fill a space between the plurality of upper wiring layers UML and a space between the plurality of bit lines BL, thereby forming the integrated circuit device 100 shown in FIGS. 2 to 3D.

Figure 14:
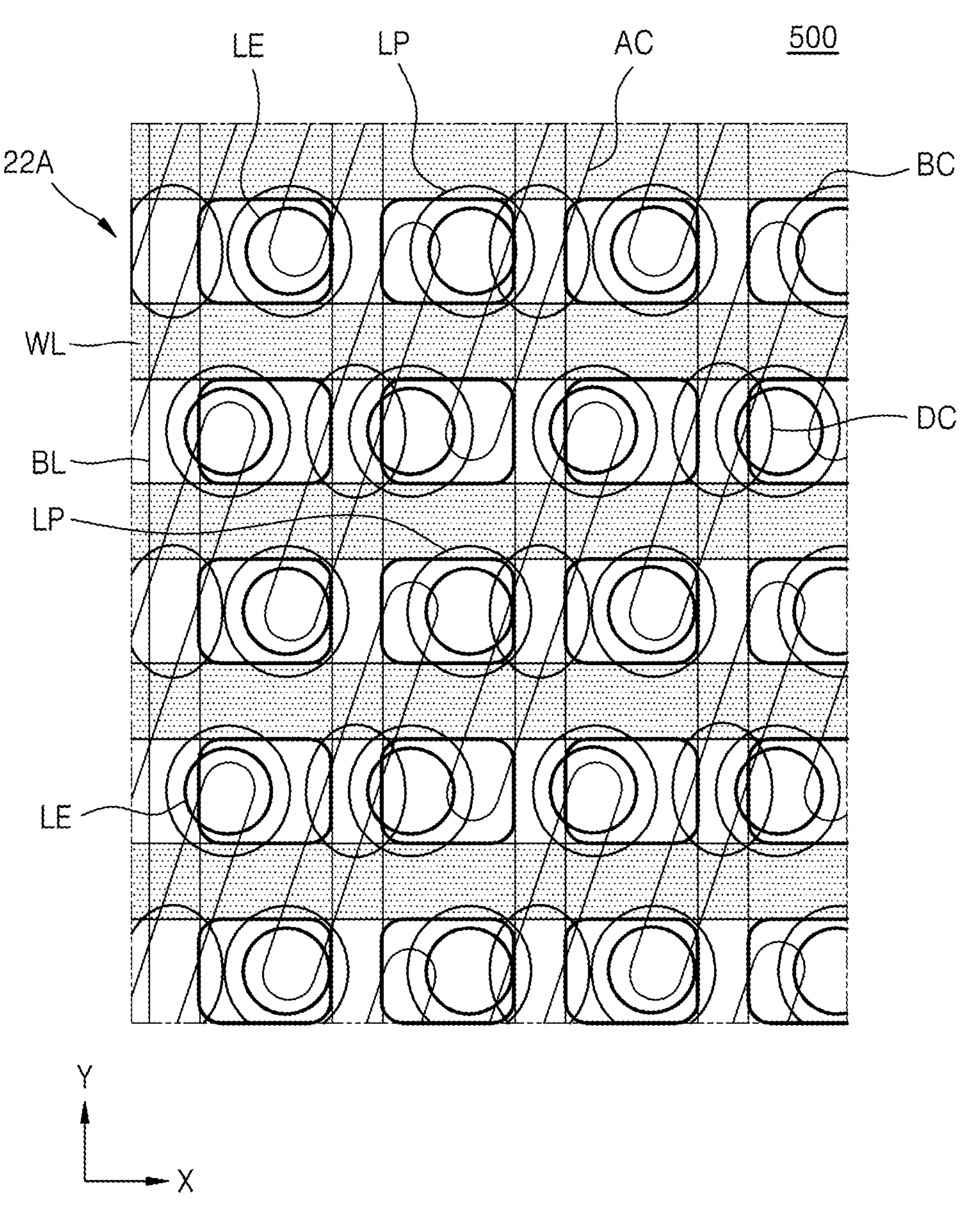
FIG. 14 is a schematic planar layout illustrating an integrated circuit device according to some embodiments.

FIG. 14 is a schematic planar layout illustrating an integrated circuit device 500 according to some embodiments.

Referring to FIG. 14, the integrated circuit device 500 may include a plurality of active regions AC horizontally arranged to extend in an oblique direction with respect to a first horizontal direction (X direction) and a second horizontal direction (Y direction), which are orthogonal to each other on a plane. A plurality of word lines WL may extend in the first horizontal direction (X direction) across the plurality of active regions AC to be parallel to each other. A plurality of bit lines BL may extend in the second horizontal direction (Y direction) over the plurality of word lines WL to be parallel to each other. Each of the plurality of bit lines BL may be connected to an active region AC via a direct contact DC.

A plurality of buried contacts BC may be between two adjacent bit lines BL from among the plurality of bit lines BL. A plurality of lower electrode landing pads LP may be respectively on the plurality of buried contacts BC. Each of the plurality of lower electrode landing pads LP may be arranged to at least partially overlap a buried contact BC. A plurality of lower electrodes LE may be respectively on the plurality of lower electrode landing pads LP to be apart from each other. The plurality of lower electrodes LE may be respectively connected to the plurality of active regions AC via the plurality of buried contacts BC and the plurality of lower electrode landing pads LP.

FIGS. 15A to 15H are cross-sectional views of stages in a method of manufacturing the integrated circuit device 500, according to some embodiments. An example of the method of manufacturing the integrated circuit device 500 shown in FIG. 14 is described with reference to FIGS. 15A to 15H.

Figure 15A:
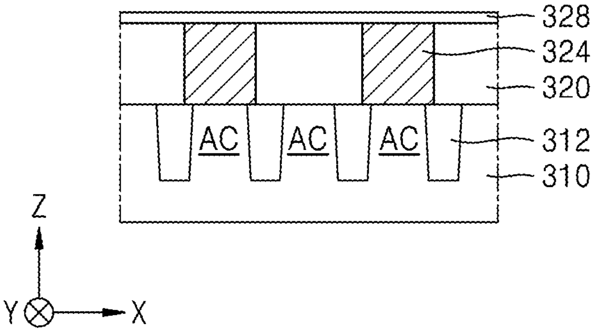
FIGS. 15A to 15H are cross-sectional views of stages in a method of manufacturing an integrated circuit device, according to some embodiments.

Referring to FIG. 15A, a lower structure 320 may be formed on a substrate 310 including the plurality of active regions AC, and then, a plurality of conductive regions 324 may be formed through the lower structure 320 to be respectively connected to the plurality of active regions AC. Next, an insulating film 328 may be formed to cover the lower structure 320 and the plurality of conductive regions 324.

The substrate 310 may include an element semiconductor, such as Si or Ge, or a compound semiconductor, such as SiC, GaAs, InAs, or InP. The substrate 310 may include structures including a semiconductor substrate and at least one insulating film or at least one conductive region, which is formed on the semiconductor substrate. The conductive region may include, e.g., an impurity-doped well or an impurity-doped structure. The plurality of active regions AC may be defined by a plurality of device isolation regions 312 formed on the substrate 310. A device isolation region 312 may include a silicon oxide film, a silicon nitride film, a silicon oxynitride film, or a combination thereof.

In an implementation, the lower structure 320 may include an insulating film, which includes a silicon oxide film, a silicon nitride film, or a combination thereof. In an implementation, the lower structure 320 may include various conductive regions, e.g., a wiring layer, a contact plug, a transistor, or the like, and an insulating film insulating such conductive regions from each other. The plurality of conductive regions 324 may each include polysilicon, a metal, a conductive metal nitride, a metal silicide, or a combination thereof. The lower structure 320 may include a plurality of bit lines constituting the integrated circuit device 500 (see FIG. 14). Each of the plurality of conductive regions 324 may include a buried contact and a lower electrode landing pad, which constitute the integrated circuit device 500 (see FIG. 14).

The insulating film 328 may include an insulating material having etch selectivity with respect to the lower structure 320. In an implementation, the insulating film 328 may include a silicon nitride (SiN) film, a silicon carbonitride (SiCN) film, a silicon boron nitride (SiBN) film, or a combination thereof. The insulating film 328 may be used as an etch stop layer in a subsequent process.

Figure 15B:
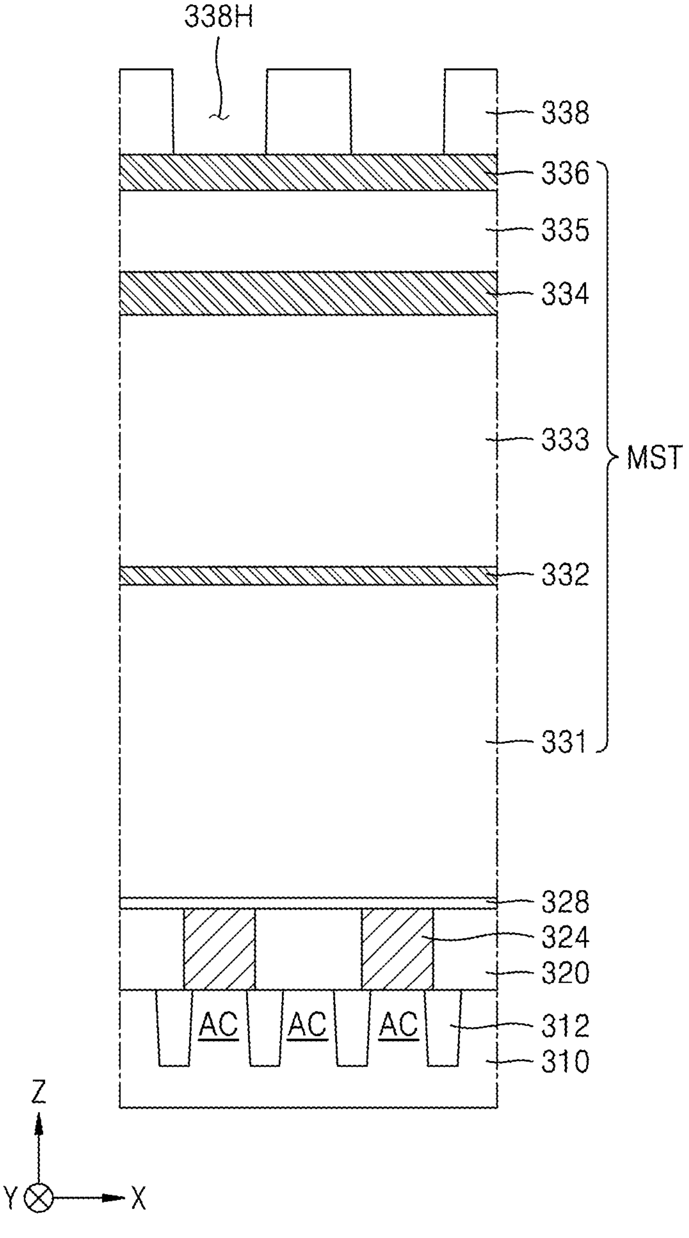

Referring to FIG. 15B, in a resulting product of FIG. 15A, a mold structure MST may be formed on the insulating film 328, and a mask pattern 338 having a plurality of openings 338H may be formed on the mold structure MST.

The mold structure MST may include a plurality of mold films and a plurality of support films. The mold structure MST may include a first mold film 331, a first support film 332, a second mold film 333, a second support film 334, a third mold film 335, and a third support film 336, which are stacked in the stated order on the insulating film 328.

In an implementation, at least one of the first mold film 331, the second mold film 333, and the third mold film 335 may include a doped silicon oxide film. In some embodiments, at least one of the first mold film 331, the second mold film 333, and the third mold film 335 may include a doped silicon oxide film including at least two dopant elements of nitrogen (N), boron (B), fluorine (F), and carbon (C). In an implementation, at least one of the first mold film 331, the second mold film 333, and the third mold film 335 may include a doped silicon oxide film including nitrogen (N) and fluorine (F) as dopant elements. At least one of the first mold film 331, the second mold film 333, and the third mold film 335 may include a doped silicon oxide film that is formed by the same method as described regarding process P10 of FIG. 1. In an implementation, to form at least one of the first mold film 331, the second mold film 333, and the third mold film 335, a PECVD process may be performed by using a silicon precursor including a compound of Formulae 1 to 6, an oxidant, and at least two dopant sources including different dopant elements from each other, thereby forming a doped silicon oxide film including at least two dopant elements. While the PECVD process is performed, an in-situ doping process, in which the dopant sources are supplied together therewith, may be performed, thereby forming the doped silicon oxide film.

In an implementation, each of the first mold film 331 and the second mold film 333 may include a doped silicon oxide film that is formed by the same method as described regarding process P10 of FIG. 1, and the third mold film 335 may include a silicon nitride film.

In an implementation, each of the first support film 332, the second support film 334, and the third support film 336 may include a silicon nitride (SiN) film, a silicon carbonitride (SiCN) film, a silicon boron nitride (SiBN) film, or a combination thereof. In an implementation, each of the first support film 332, the second support film 334, and the third support film 336 may include a silicon carbonitride (SiCN) film.

In an implementation, the mask pattern 338 may include a carbon-containing film. In an implementation, the mask pattern 338 may include, e.g., an amorphous carbon layer (ACL), a spin-on-hardmask (SOH), a photoresist, or a combination thereof.

Figure 15C:
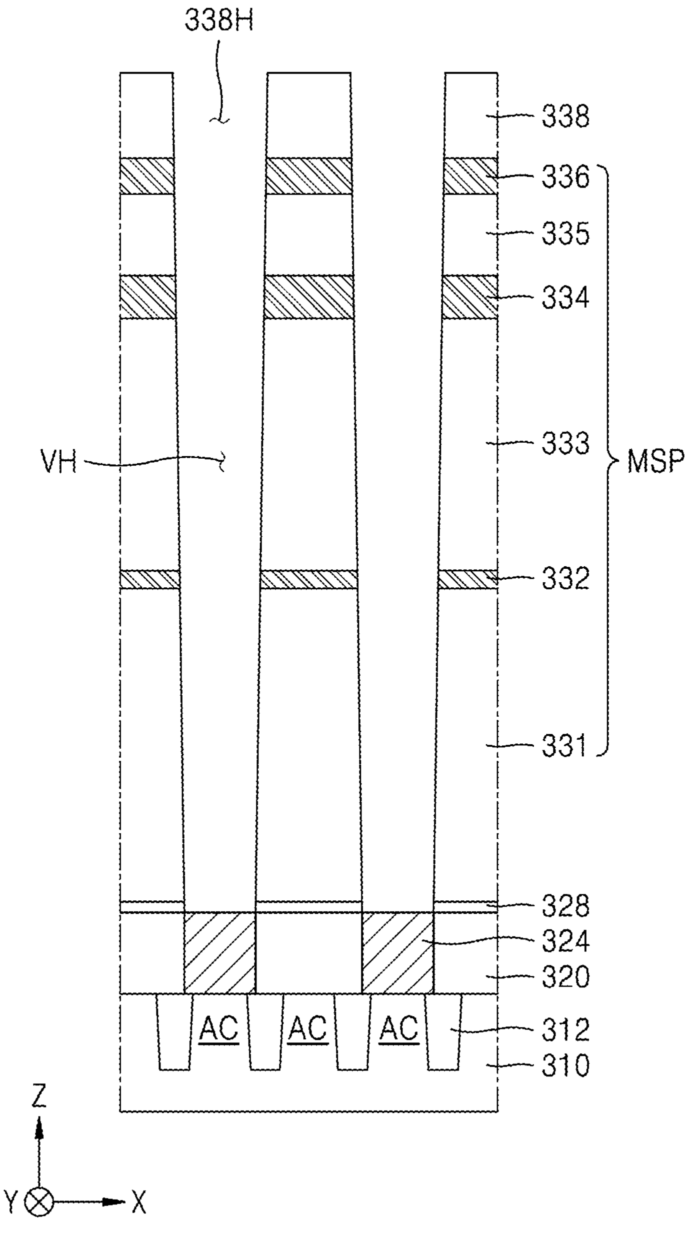

Referring to FIG. 15C, in a resulting product of FIG. 15B, an anisotropic dry etching process using plasma may be performed on the mold structure MST and the insulating film 328 by using the mask pattern 338 as an etch mask and the insulating film 328 as an etch stop layer, thereby forming a mold structure pattern MSP, which defines a plurality of vertical holes VH. The process of forming the plurality of vertical holes VH may include a process of etching the insulating film 328 such that the conductive region 324 is exposed at the bottom of each of the plurality of vertical holes VH.

While the plasma etching process for forming the plurality of vertical holes VH is performed, etching target films may be etched with relatively high etch selectivity with respect to the mask pattern 338. In an implementation, an intended etch rate may be obtained in forming the plurality of vertical holes VH, and critical dimensions (CDs) of the plurality of vertical holes VH may be easily controlled.

Figure 15D:
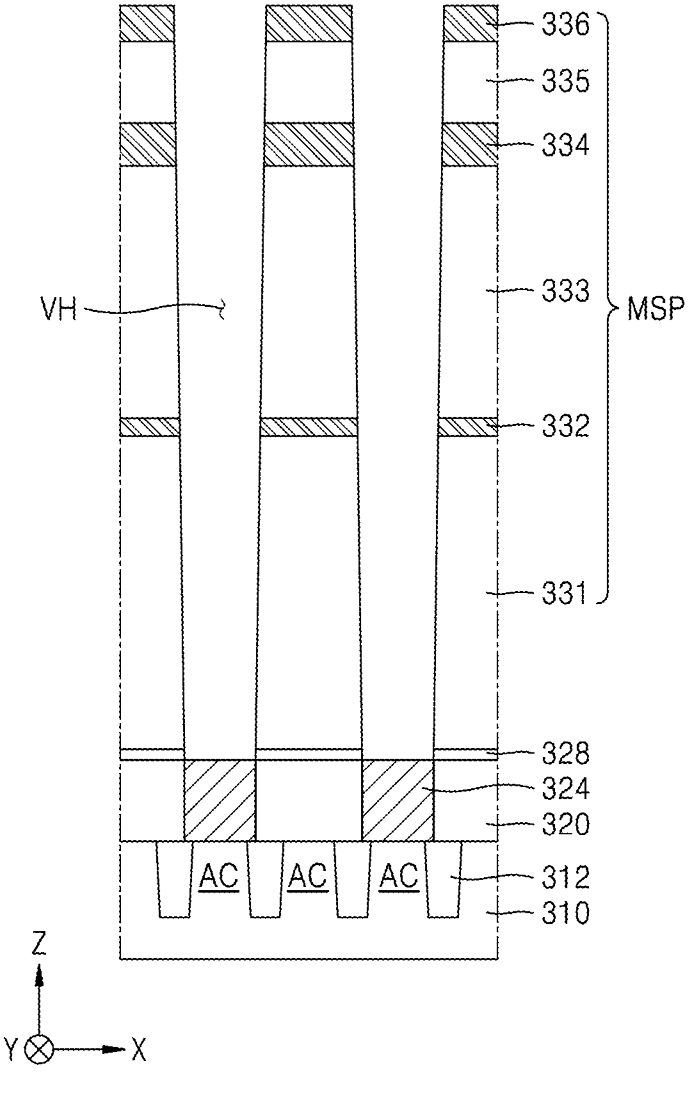

Referring to FIG. 15D, in a resulting product of FIG. 15C, the mask pattern 338 and etching by-products may be removed by an ashing process and a strip process, thereby exposing an upper surface of the third support film 336.

Figure 15E:
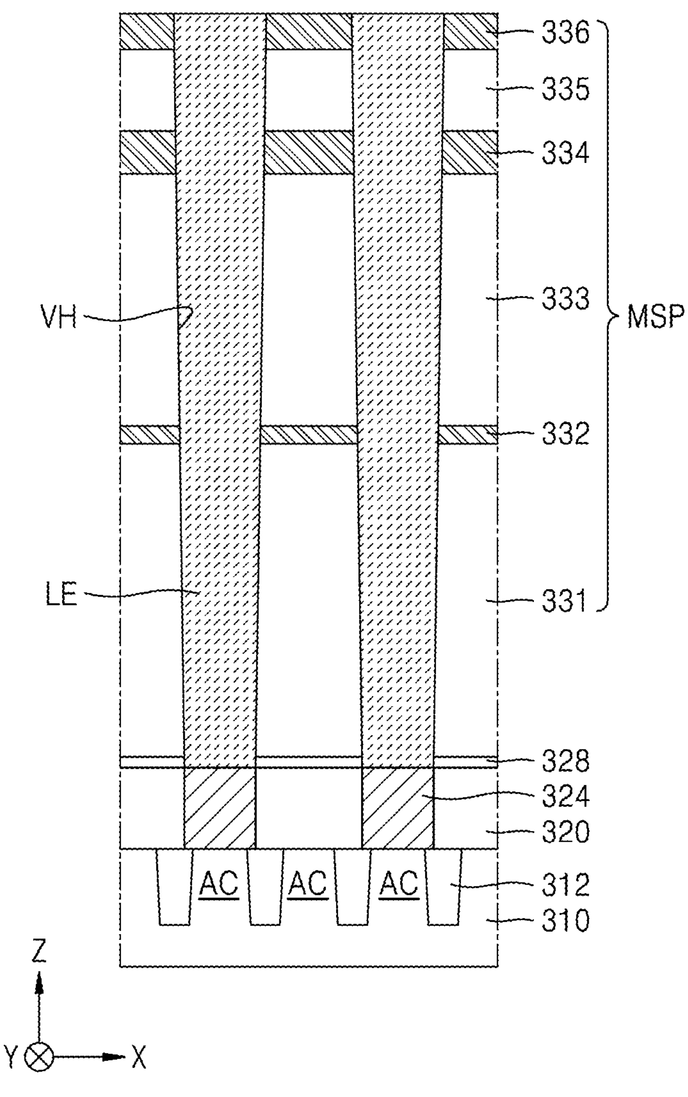

Referring to FIG. 15E, in a resulting product of FIG. 15D, the plurality of lower electrodes LE may be formed to respectively fill the plurality of vertical holes VH.

In an implementation, to form the plurality of lower electrodes LE, a conductive layer may be formed on the resulting product of FIG. 15D to fill the plurality of vertical holes VH and cover the upper surface of the third support film 336. To form the conductive layer, a CVD, PECVD, metal organic CVD (MOCVD), or ALD process may be used. Next, a portion of the conductive layer may be removed by an etch-back process or a CMP process, thereby exposing the upper surface of the third support film 336.

In an implementation, each of the plurality of lower electrodes LE may include a metal film, a conductive metal oxide film, a conductive metal nitride film, a conductive metal oxynitride film, or a combination thereof. In an implementation, each of the plurality of lower electrodes LE may include Nb, Nb oxide, Nb nitride, Nb oxynitride, Ti, Ti oxide, Ti nitride, Ti oxynitride, Co, Co oxide, Co nitride, Co oxynitride, Sn, Sn oxide, Sn nitride, Sn oxynitride, or a combination thereof. In an implementation, each of the plurality of lower electrodes LE may include NbN, TiN, CoN, $SnO_2$, or a combination thereof. In an implementation, each of the plurality of lower electrodes LE may include TaN, TiAlN, TaAlN, V, VN, Mo, MoN, W, WN, Ru, $RuO_2$, $SrRuO_3$, Ir, $IrO_2$, Pt, PtO, $SrRuO_3$ (SRO), $(Ba,Sr)RuO_3$ (BSRO), $CaRuO_3$ (CRO), $(La,Sr)CoO_3$ (LSCO), or a combination thereof.

Figure 15F:
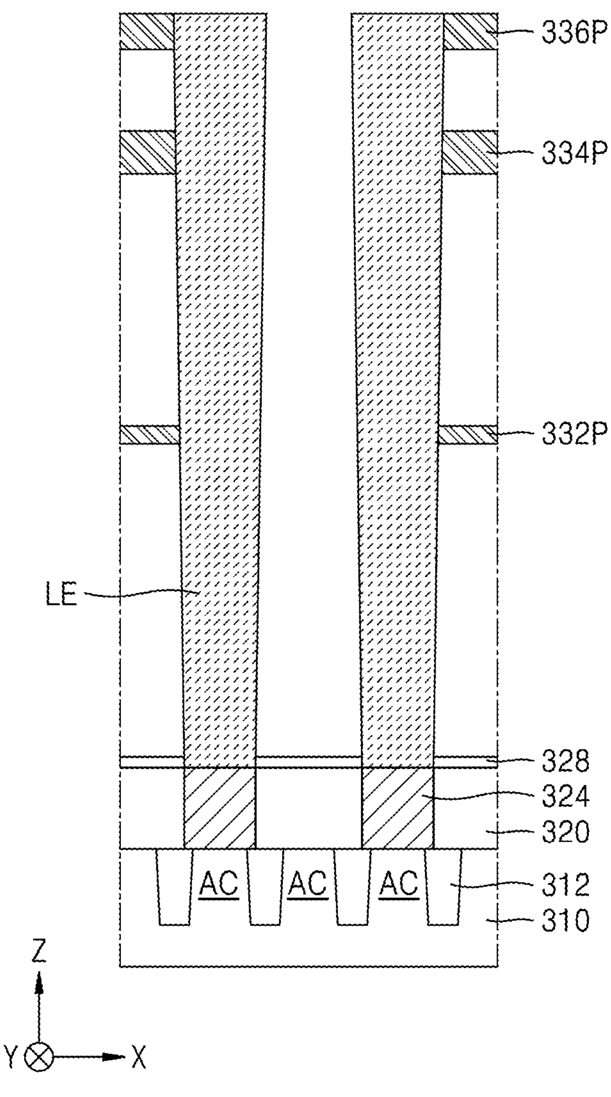

Referring to FIG. 15F, in a resulting product of FIG. 15E, a third support pattern 336P may be formed by removing a portion of the third support film 336, and the third mold film 335 exposed as a result thereof may be removed in a wet manner. Next, a second support pattern 334P may be formed by removing a portion of the second support film 334, and the second mold film 333 exposed as a result thereof may be removed in a wet manner. Next, a first support pattern 332P may be formed by removing a portion of the first support film 332, and the first mold film 331 exposed as a result thereof may be removed in a wet manner. After the first mold film 331, the second mold film 333, and the third mold film 335 are removed, sidewalls of the plurality of lower electrodes LE may be exposed.

Figure 15G:
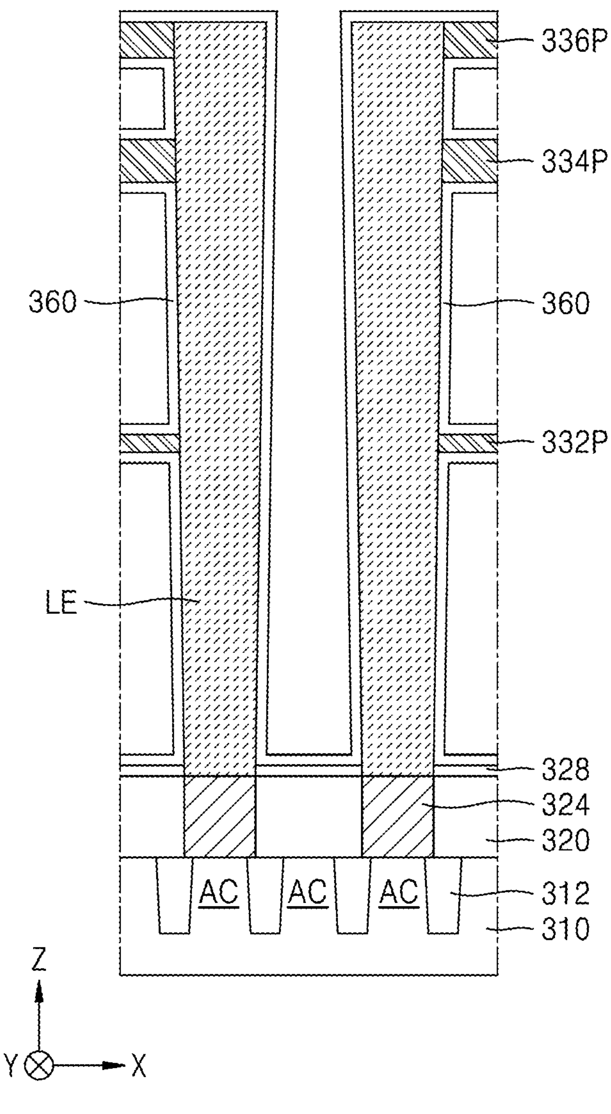

Referring to FIG. 15G, in a resulting product of FIG. 15F, a dielectric film 360 may be formed to cover exposed surfaces. To form the dielectric film 360, an ALD process may be used.

In an implementation, the dielectric film 360 may include a high-K film. As used herein, the term "high-K film" refers to a dielectric film having a dielectric constant that is higher than that of a silicon oxide film. In an implementation, the dielectric film 360 may include a metal oxide including hafnium (Hf), zirconium (Zr), aluminum (Al), niobium (Nb), cerium (Ce), lanthanum (La), tantalum (Ta), or titanium (Ti). In an implementation, the dielectric film 360 may have a single-layer structure including one high-K film. In an implementation, the dielectric film 360 may have a multilayer structure including a plurality of high-K films. The high-K film may include, e.g., $HfO_2$, $ZrO_2$, $Al_2O_3$, $La_2O_3$, $Ta_2O_3$, $Nb_2O_5$, $CeO_2$, $TiO_2$, $GeO_2$, or a combination thereof. In an implementation, the dielectric film 360 may have a thickness of about 20 Å to about 80 Å.

Figure 15H:
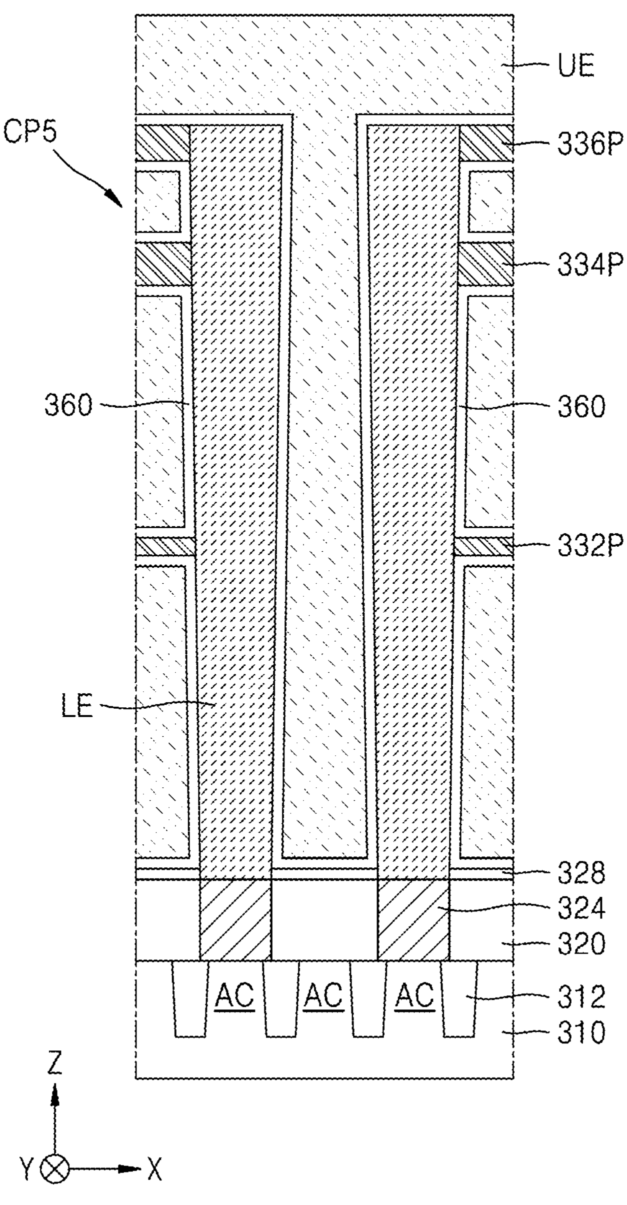

Referring to FIG. 15H, an upper electrode UE may be formed on a resulting product of FIG. 15G to cover the dielectric film 360. In some embodiments, to form the upper electrode UE, a CVD, MOCVD, physical vapor deposition (PVD), or ALD process may be used.

In an implementation, the upper electrode UE may include a metal film, a conductive metal oxide film, a conductive metal nitride film, a conductive metal oxynitride film, or a combination thereof. In an implementation, the upper electrode UE may include Nb, Nb oxide, Nb nitride, Nb oxynitride, Ti, Ti oxide, Ti nitride, Ti oxynitride, Co, Co oxide, Co nitride, Co oxynitride, Sn, Sn oxide, Sn nitride, Sn oxynitride, or a combination thereof. In an implementation, the upper electrode UE may include NbN, TiN, CoN, $SnO_2$, or a combination thereof. In an implementation, the upper electrode UE may include TaN, TiAlN, TaAlN, V, VN, Mo, MoN, W, WN, Ru, $RuO_2$, $SrRuO_3$, Ir, $IrO_2$, Pt, PtO, $SrRuO_3$ (SRO), $(Ba,Sr)RuO_3$ (BSRO), $CaRuO_3$ (CRO), $(La,Sr)CoO_3$ (LSCO), or a combination thereof. In an implementation, the upper electrode UE may further include a non-metallic conductive film. The non-metallic conductive film may include a doped SiGe layer. In an implementation, the non-metallic conductive film may include an SiGe layer doped with boron.

In FIG. 15H, the upper electrode UE may face the plurality of lower electrodes LE with the dielectric film 360 therebetween. The plurality of lower electrodes LE, the dielectric film 360, and the upper electrode UE may constitute a plurality of capacitors CP5.

Along with making the integrated circuit device 500 finer in size, the pitch of the plurality of lower electrodes LE respectively constituting the plurality of capacitors CP5 may decrease, and aspect ratios of the plurality of lower electrodes LE may increase. According to the manufacturing method of the integrated circuit device 500, which is described with reference to FIGS. 15A to 15H, while a plasma-type dry etching process is performed to form the plurality of vertical holes VH having relatively high aspect ratios, as described with reference to FIG. 15C, etching target films may be etched with relatively high etch selectivity with respect to the mask pattern 338. In addition, an intended etch rate may be obtained in forming the plurality of vertical holes VH, and the CDs of the plurality of vertical holes VH may be easily controlled. Therefore, the reliability of the integrated circuit device 500 may be secured, and the productivity of a manufacturing process of the integrated circuit device 500 may improve.

One or more embodiments may provide a method of manufacturing an integrated circuit device, the method including a process of forming a silicon oxide film doped with a dopant element.

One or more embodiments may provide a method of manufacturing an integrated circuit device, which includes 3-dimensionally arranged unit devices, the method allowing the generation of defects due to a difference in etch rate between a plurality of films to be prevented and the electrical characteristics and reliability of structures formed in a plurality of vertical holes to be maintained, even when the plurality of films including various materials need to be simultaneously etched, in the case where the heights of the unit devices in a vertical direction are increased for improving the degree of integration, and thus, the plurality of vertical holes having relatively high aspect ratios may be formed for forming structures such as contact structures, channel structures, and capacitors.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an integrated circuit device, the method comprising:

forming a doped silicon oxide film on a substrate by supplying, onto the substrate, a silicon precursor, an oxidant, and at least two dopant sources including dopant elements that are different from each other such that the doped silicon oxide film includes at least two dopant elements;

forming a vertical hole in the doped silicon oxide film by dry-etching the doped silicon oxide film; and forming a vertical structure in the vertical hole, wherein:

the silicon precursor includes a monosilane compound, a disilane compound, a siloxane compound, or a combination thereof, and the silicon precursor includes:

a Si—H functional group, and a C1-C10 oxy group or a C1-C10 organoamino group.

2. The method as claimed in claim 1, wherein:

the silicon precursor is represented by Formula 1:

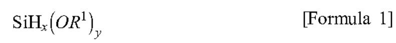

[Formula 1]

in Formula 1, $R^1$ is a C1-C10 linear or branched alkyl group, a C2-C10 linear or branched alkenyl group, a C2-C10 linear or branched alkynyl group, a C3-C10 cycloalkyl group, or a C6-C10 aryl group, and x+y=4, x is an integer of 1 to 3, and y is an integer of 1 to 3.

3. The method as claimed in claim 1, wherein:

the silicon precursor is represented by Formula 2:

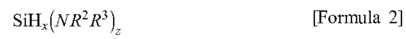

[Formula 2]

in Formula 2, $R^2$ and $R^3$ are each independently a C1-C10 linear or branched alkyl group, a C2-C10 linear or branched alkenyl group, a C2-C10 linear or branched alkynyl group, a C3-C10 cycloalkyl group, or a C6-C10 aryl group, and x+z=4, x is an integer of 1 to 3, and z is an integer of 1 to 3.

4. The method as claimed in claim 1, wherein:

the silicon precursor is represented by Formula 3:

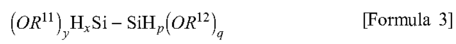

[Formula 3]

in Formula 3, $R^{11}$ and $R^{12}$ are each independently a C1-C10 linear or branched alkyl group, a C2-C10 linear or branched alkenyl group, a C2-C10 linear or branched alkynyl group, a C3-C10 cycloalkyl group, or a C6-C10 aryl group, x+y=4, x is an integer of 1 to 3, y is an integer of 1 to 3, and p+q=4, p is an integer of 1 to 3, and q is an integer of 1 to 3.

5. The method as claimed in claim 1, wherein:

the silicon precursor is represented by Formula 4:

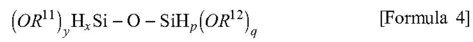

[Formula 4]

in Formula 4, $R^{11}$ and $R^{12}$ are each independently a C1-C10 linear or branched alkyl group, a C2-C10 linear or branched alkenyl group, a C2-C10 linear or branched alkynyl group, a C3-C10 cycloalkyl group, or a C6-C10 aryl group, x+y=4, x is an integer of 1 to 3, y is an integer of 1 to 3, and p+q=4, p is an integer of 1 to 3, and q is an integer of 1 to 3.

6. The method as claimed in claim 1, wherein the dopant elements include boron (B), phosphorus (P), nitrogen (N), fluorine (F), carbon (C), aluminum (Al), sulfur(S), arsenic (As), germanium (Ge), or antimony (Sb).

7. The method as claimed in claim 1, wherein the oxidant includes $O_2$, $O_3$, $O_2$ plasma, $H_2O$, $NO_2$, NO, nitrous oxide ($N_2O$), CO, $CO_2$, $H_2O_2$, HCOOH, $CH_3COOH$, $(CH_3CO)_2O$, an alcohol, a peroxide, sulfur oxide, or a combination thereof.

8. The method as claimed in claim 1, wherein forming the doped silicon oxide film includes forming a silicon oxide film doped with phosphorus (P) and nitrogen (N).

9. The method as claimed in claim 1, wherein forming the doped silicon oxide film includes forming a silicon oxide film doped with nitrogen (N) and fluorine (F).

10. The method as claimed in claim 1, wherein forming the doped silicon oxide film includes performing a plasma-enhanced chemical vapor deposition (PECVD) process.

11. The method as claimed in claim 1, further comprising, before the forming of the doped silicon oxide film, forming a plurality of silicon oxide films and a plurality of silicon nitride films on the substrate to be alternately stacked one by one in a vertical direction, wherein, in the forming of the vertical hole in the doped silicon oxide film, the vertical hole is formed through each of the plurality of silicon oxide films, the plurality of silicon nitride films, and the doped silicon oxide film by dry-etching the plurality of silicon oxide films, the plurality of silicon nitride films, and the doped silicon oxide film.

12. The method as claimed in claim 1, further comprising, before the forming of the doped silicon oxide film, or after the forming of the doped silicon oxide film, forming, on the substrate, a nitride film including a silicon nitride (SiN) film, a silicon carbonitride (SiCN) film, a silicon boron nitride (SiBN) film, or a combination thereof, wherein, in the forming of the vertical hole in the doped silicon oxide film, the vertical hole is formed through each of the nitride film and the doped silicon oxide film by dry-etching the nitride film and the doped silicon oxide film.

13. A method of manufacturing an integrated circuit device, the method comprising:

forming a first structure on a substrate such that the first structure includes a nitride film;

forming a doped silicon oxide film on the first structure by supplying, onto the first structure, a silicon precursor, an oxidant, and at least two dopant sources including dopant elements that are different from each other such that the doped silicon oxide film includes at least two dopant elements;

forming a plurality of vertical holes through the doped silicon oxide film and the first structure by dry-etching the doped silicon oxide film and the first structure; and respectively forming a plurality of vertical structures in the plurality of vertical holes, wherein the silicon precursor includes a monosilane compound including C1-C10 oxy group and a Si—H functional group, a monosilane compound including a C1-C10 organoamino group and a Si—H functional group, a disilane compound including a C1-C10 oxy group and a Si—H functional group, a siloxane compound including a C1-C10 oxy group and a Si—H functional group, or a combination thereof.

14. The method as claimed in claim 13, wherein:

the silicon precursor includes a compound represented by Formula 1, Formula 2, Formula 3, or Formula 4:

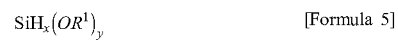

[Formula 5]

in Formula 1, x+y=4, x is an integer of 1 to 3, and y is an integer of 1 to 3;

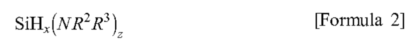

[Formula 2]

in Formula 2, x+z=4, x is an integer of 1 to 3, and z is an integer of 1 to 3;

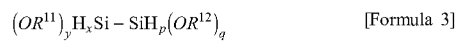

[Formula 3]

in Formula 3, x+y=4, x is an integer of 1 to 3, y is an integer of 1 to 3, p+q=4, p is an integer of 1 to 3, and q is an integer of 1 to 3;

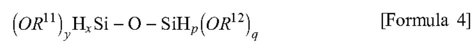

[Formula 4]

in Formula 4, x+y=4, x is an integer of 1 to 3, y is an integer of 1 to 3, p+q=4, p is an integer of 1 to 3, and q is an integer of 1 to 3, and in Formulae 1, 2, 3, and 4, $R^1$, $R^2$, $R^3$, $R^{11}$, and $R^{12}$ are each independently a C1-C10 linear or branched alkyl group, a C2-C10 linear or branched alkenyl group, a C2-C10 linear or branched alkynyl group, a C3-C10 cycloalkyl group, or a C6-C10 aryl group.

15. The method as claimed in claim 13, wherein the dopant elements include boron (B), phosphorus (P), nitrogen (N), fluorine (F), carbon (C), aluminum (Al), sulfur(S), arsenic (As), germanium (Ge), or antimony (Sb).

16. The method as claimed in claim 13, wherein the oxidant includes $O_2$, $O_3$, $O_2$ plasma, $H_2O$, $NO_2$, NO, nitrous oxide ($N_2O$), CO, $CO_2$, $H_2O_2$, HCOOH, $CH_3COOH$, $(CH_3CO)_2O$, an alcohol, a peroxide, sulfur oxide, or a combination thereof.

17. A method of manufacturing an integrated circuit device, the method comprising:

forming a first structure, in which a plurality of silicon oxide films and a plurality of silicon nitride films are alternately stacked one by one in a vertical direction, on a substrate in a first area and a second area adjacent to each other in a horizontal direction;

forming a doped silicon oxide film, which includes at least two dopant elements, in the second area to cover the first structure and the substrate by supplying, onto the substrate in the second area, a silicon precursor, an oxidant, and at least two dopant sources including dopant elements that are different from each other;

forming a plurality of first vertical holes through the first structure in the first area and a plurality of second vertical holes through the doped silicon oxide film and the first structure in the second area, by simultaneously dry-etching the first structure and the doped silicon oxide film in the first area and the second area; and forming a plurality of vertical structures to respectively fill insides of the plurality of first vertical holes and the plurality of second vertical holes, wherein the silicon precursor includes a monosilane compound including C1-C10 oxy group and a Si—H functional group, a monosilane compound including a C1-C10 organoamino group and a Si—H functional group, a disilane compound including a C1-C10 oxy group and a Si—H functional group, a siloxane compound including a C1-C10 oxy group and a Si—H functional group, or a combination thereof.

18. The method as claimed in claim 17, wherein:

the silicon precursor is represented by Formula 1:

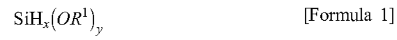

$$SiH_x(OR^1)_y \quad \text{[Formula 1]}$$

in Formula 1, $R^1$ is a C1-C10 linear or branched alkyl group, a C2-C10 linear or branched alkenyl group, a C2-C10 linear or branched alkynyl group, a C3-C10 cycloalkyl group, or a C6-C10 aryl group, and x+y=4, x is an integer of 1 to 3, and y is an integer of 1 to 3.

19. The method as claimed in claim 17, wherein:

the silicon precursor is represented by Formula 2:

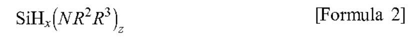

$$SiH_x(NR^2R^3)_z \quad \text{[Formula 2]}$$

in Formula 2, $R^2$ and $R^3$ are each independently a C1-C10 linear or branched alkyl group, a C2-C10 linear or branched alkenyl group, a C2-C10 linear or branched alkynyl group, a C3-C10 cycloalkyl group, or a C6-C10 aryl group, and x+z=4, x is an integer of 1 to 3, and z is an integer of 1 to 3.

20. The method as claimed in claim 17, wherein the at least two dopant sources include phosphorus (P), nitrogen (N), or fluorine (F).

* * * * *